US006837632B2

(12) United States Patent
Koyama et al.

(10) Patent No.: US 6,837,632 B2
(45) Date of Patent: Jan. 4, 2005

(54) SUBSTRATE TREATING APPARATUS

(75) Inventors: Yasufumi Koyama, Kyoto (JP); Kenji Kamei, Kyoto (JP); Toru Kitamoto, Kyoto (JP); Kenji Hashinoki, Kyoto (JP); Satoshi Yamamoto, Kyoto (JP); Toshiaki Dainin, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 0 days.

(21) Appl. No.: 10/646,902

(22) Filed: Aug. 22, 2003

(65) Prior Publication Data

US 2004/0037677 A1 Feb. 26, 2004

(30) Foreign Application Priority Data

Aug. 23, 2002 (JP) ........................................ 2002-243213

(51) Int. Cl.[7] ........................... G03D 5/00; B65G 49/07; B05C 13/00
(52) U.S. Cl. ....................... 396/611; 414/935; 118/500
(58) Field of Search ....................... 396/611; 414/225, 414/935, 937, 940; 118/500, 503; 355/27

(56) References Cited

U.S. PATENT DOCUMENTS 5,651,823 A  *  7/1997  Parodi et al. ............... 118/500
6,515,731 B1 *  2/2003  Akimoto ..................... 355/27

FOREIGN PATENT DOCUMENTS

JP            7-171478        *  7/1995

* cited by examiner

*Primary Examiner*—Alan Mathews
(74) *Attorney, Agent, or Firm*—Ostrolenk, Faber, Gerb & Soffen, LLP

(57) ABSTRACT

A substrate treating apparatus has an antireflection film forming block, a resist film forming block and a developing block arranged in juxtaposition, each of these blocks including treating modules and a single main transport mechanism. The main transport mechanism transports substrates within each block, and transfers the substrates between the blocks through inlet substrate rests and outlet substrate rests provided as separate components. This construction realizes improved throughput of the substrate treating apparatus.

31 Claims, 13 Drawing Sheets

Fig. 11

| Transport step | 1st main transport mech. | Transport step | 2nd main transport mech. | Transport step | 3rd main transport mech. | Transport step | 4th main transport mech. |
|---|---|---|---|---|---|---|---|
| 1+α | PASS1 PASS2 → | 1+α | PASS3 PASS4 → | 1+α | PASS5 PASS6 → | 1+α | PASS7 PASS8 → |
| 2 | CP → | 2 | CP → | 2+α | PASS7 PASS8 → | 2 | EEW → |
| 3 | BARC → | 3 | PR → | 3 | CP → | 3 | CP → |
| 4 | HP → | 4 | PHP → | 4 | SD → | 4+α | PASS9 PASS10 → |
| 5 | WCP → | 5 | CP → | 5 | HP → | 5 | PEB |
| 6+α | PASS3 PASS4 | 6+α | PASS5 PASS6 | 6 | WCP | | |

SUBSTRATE TREATING APPARATUS

BACKGROUND OF THE INVENTION (1) Field of the Invention

This invention relates to a substrate treating apparatus for performing a series of treatments of substrates such as semiconductor wafers, glass substrates for liquid crystal displays, glass substrates for photomasks, and substrates for optical disks (hereinafter called simply "substrates").

(2) Description of the Related Art

Conventionally, such a substrate treating apparatus is used, for example, in a photolithographic process for forming photoresist film on substrates, exposing the substrates having the photoresist film formed thereon, and developing the exposed substrates.

This apparatus will be described with reference to a plan view shown in FIG. 1. This substrate treating apparatus includes an indexer 103 having a cassette table 101 for receiving a plurality of cassettes C each for containing a plurality of (e.g. 25) wafers W to be treated, or wafers W having been treated in treating modules 104 described hereinafter, and a transport mechanism 108a movable horizontally along the cassettes C for transporting the wafers W between the cassettes C and treating modules 104. The apparatus further includes, besides the treating modules 104, a main substrate transport path 105 along which the wafers W are transported from one treating module 104 to another, and an interface 106 for transferring the wafers W between the treating modules 104 and an external treating apparatus 107.

The external treating apparatus 107 is an apparatus separate from the substrate treating apparatus, and is detachably attached to the interface 106 of the substrate treating apparatus. Where the substrate treating apparatus is designed for resist application and development as noted above, the external treating apparatus 107 is an exposing apparatus for exposing the wafers W.

The substrate treating apparatus further includes a main transport mechanism 108b movable along the main substrate transport path 105, and a transport mechanism 108c movable along a transport path of the interface 106. In addition, a table 109a is disposed at a connection between the indexer 103 and main substrate transport path 105, and a table 109b at a connection between the main substrate transport path 105 and interface 106.

The above substrate treating apparatus performs substrate treatment through the following procedure. The transport mechanism 108a takes one wafer W out of a cassette C containing wafers W to be treated, and transports this wafer W to the table 109a to pass the wafer W to the main transport mechanism 108b. The main transport mechanism 108b, after receiving the wafer W placed on the table 109a, transports the wafer W into each treating module 104 for a predetermined treatment (e.g. resist application) in the treating module 104. Upon completion of each predetermined treatment, the main transport mechanism 108b takes the wafer W out of the treating module 104, and transports the wafer W into another treating module 104 for a next treatment (e.g. heat treatment).

After the series of pre-exposure treatment is completed, the main transport mechanism 108b transports the wafer W treated in the treating modules 104 to the table 109b, and deposits the wafer W on the table 109b to pass the wafer W to the transport mechanism 108c. The transport mechanism 108c receives the wafer W placed on the table 109b and transports the wafer W to the external treating apparatus 107. The transport mechanism 108c loads the wafer W into the external treating apparatus 107 and, after a predetermined treatment (e.g. exposure), takes the wafer W out of the external treating apparatus 107 to transport it to the table 109b. Subsequently, the main transport mechanism 108b transports the wafer W to the treating modules 104 where a series of post-exposure heating and cooling treatment and development is performed. The wafer W having gone through all the treatment is loaded by the transport mechanism 108a into a predetermined cassette C. The cassette C is transported away from the cassette table 101 to complete a series of substrate treatment.

The conventional apparatus having such a construction has the following drawback.

In the conventional substrate treating apparatus, the single main transport mechanism 108b movable along the main substrate transport path 105 transports the wafer W to and from all the treating modules 104. Because of its working speed, the main transport mechanism 108b cannot access many treating modules 104 within a short time. Consequently, the conventional substrate treating apparatus cannot meet the present-day requirement for improvement in throughput.

SUMMARY OF THE INVENTION

This invention has been made having regard to the state of the art noted above, and its primary object is to provide a substrate treating apparatus with improved throughput.

The above object is fulfilled, according to this invention, by a substrate treating apparatus having a plurality of treating blocks arranged in juxtaposition, each of the treating blocks including treating modules for performing required treatments of substrates, and a single main transport mechanism for transferring the substrates to and from the treating modules, wherein each of the treating blocks includes, as separate components, inlet substrate rests for receiving the substrates to be accepted to the treating block, and outlet substrate rests for receiving the substrates to be delivered from the treating block, and the main transport mechanism of each of the treating blocks is arranged to transfer the substrates through the inlet substrate rests and the outlet substrate rests.

According to this invention, substrates are successively treated in the plurality of treating blocks arranged in juxtaposition. In the respective treating blocks, the main transport mechanisms transfer the substrates to and from the treating modules in parallel. That is, with the main transport mechanisms of the respective treating blocks operable simultaneously and in parallel, the transfer of substrates to and from the treating modules is expedited equivalently, thereby to improve the throughput of the substrate treating apparatus. Moreover, with inlet substrate rests and outlet substrate rests provided separately from each other, no interference occurs in the substrate rests between a substrate received in each treating block and a substrate delivered from this treating block. Thus, substrates may be transported smoothly between the treating units.

In another aspect of the invention, there is provided a substrate treating apparatus having a plurality of controlled units arranged in juxtaposition, each of the controlled units including treating modules for performing required treatments of substrates, and a single main transport mechanism for transferring the substrates to and from the treating modules, wherein each of the controlled units includes, as separate components, inlet substrate rests for receiving the substrates to be accepted to the controlled unit, and outlet substrate rests for receiving the substrates to be delivered from the controlled unit, the main transport mechanism of each of the controlled units is arranged to transfer the substrates through the inlet substrate rests and the outlet substrate rests, each of the controlled units includes a unit control device for controlling at least a substrate transfer operation of the main transport mechanism, and the unit control device is independently operable to control a series of substrate transports including transfer of the substrates to and from the treating modules and transfer of the substrates to and from the substrate rests.

This intention is intended to improve the throughput of the substrate treating apparatus from a control aspect also. The control system of this invention is what is known as a decentralized control. For this purpose, the substrates are transferred between the controlled units through the inlet and outlet substrate rests. The task assigned to the control device of each controlled unit is only a series of controls, starting with receipt of a substrate from an inlet substrate rest, and finishing with placement of the substrate on an outlet substrate rest. That is, it is not necessary to consider movement of the main transport mechanism in the adjoining controlled unit. Thus, the control device of each controlled unit has a reduced load to improve the throughput of the substrate treating apparatus. The number of controlled units may also be increased or decreased relatively easily. As opposed to this, conventional substrate treatment is performed under centralized control of substrate transport mechanisms and treating units. A complicated determination (scheduling) must be made regarding an order of operation of the substrate transport mechanisms and treating units. This is one of the causes that hamper improvement in throughput.

In the invention noted above, the inlet substrate rests and outlet substrate rests reflect the functions of the substrate rests as seen from one treating block (or controlled unit). That is, the outlet substrate rest of a certain treating block (or controlled unit) corresponds to the inlet substrate rest as seen from a treating block (or controlled unit) adjoining that treating block. Thus, between the adjacent treating blocks (or controlled units), the outlet substrate rest and inlet port substrate rest are in agreement.

Preferably, the inlet substrate rests include a feed inlet substrate rest for use in transporting the substrates forward through each of the treating blocks or controlled units, and a return inlet substrate rest for use in transporting the substrates backward through each of the treating blocks or controlled units, and the outlet substrate rests include a feed outlet substrate rest for use in transporting the substrates forward through each of the treating blocks or controlled units, and a return outlet substrate rest for use in transporting the substrates backward through each of the treating blocks or controlled units.

With this construction, when transporting a substrate forward between the treating blocks or controlled units, the substrate is transferred through the feed inlet substrate rest and feed outlet substrate rest. When transporting a substrate to backward between the treating blocks or controlled units, the substrate is transferred through the return inlet substrate rest and return outlet substrate rest. Thus, no interference occurs in the substrate rests between the substrate transported forward between the treating blocks or controlled units and the substrate transported backward between the treating blocks or controlled units. The substrates may be transported in the opposite directions smoothly between the treating blocks (or between the controlled units).

Preferably, at least one of the treating blocks or controlled units has an additional inlet substrate rest and an additional outlet substrate rest besides the feed inlet substrate rest, the return inlet substrate rest, the feed outlet substrate rest and the return outlet substrate rest. With this construction, substrates may be transferred to and from a different treating block (or controlled unit) through the additional inlet substrate rest and outlet substrate rest. This provides improved freedom for arranging the treating blocks (or controlled units).

Preferably, the feed inlet substrate rest and the return outlet substrate rest are arranged close to each other, and the return inlet substrate rest and the feed outlet substrate rest are arranged close to each other. This construction allows the main transport mechanism to transfer substrates by moving quickly to the return inlet substrate rest (or the feed inlet substrate rest after placing a substrate on the feed outlet substrate rest (or the return outlet substrate rest).

It is further preferred that the feed inlet substrate rest and the return outlet substrate rest are arranged vertically, and the return inlet substrate rest and the feed outlet substrate rest are arranged vertically. With this construction, where substrates are placed in horizontal posture on the substrate rests, a reduced space may be set between the upper and lower substrate rests. As a result, the main transport mechanism may move quickly between the upper and lower substrate rests to transfer substrates to and from the two substrate rests with increased efficiency.

In this invention, each substrate rest is not limited to a construction for accommodating a single substrate at a time, but may receive a plurality of substrates arranged vertically in multiple stages. Where the substrate rest can receive only one substrate at a time, a next substrate cannot be placed on the substrate rest while a substrate remains on the substrate rest. The main transport mechanism must receive the substrate from the substrate rest before the next substrate is placed on the substrate rest. This constitutes restrictions on the control of the main transport mechanism in transporting the substrates to various treating modules. On the other hand, where the substrate rest of the multi-stage construction is used, the above restrictions are eased to facilitate the control of the main transport mechanism. In addition, the substrate rest of the multi-stage construction can temporarily store a plurality of substrates when, for example, an abnormality occurs with a certain treating module.

Where flowing of the atmosphere between adjacent treating blocks (controlled units) through the substrate rests is undesirable, shutter mechanisms, preferably, are provided for opening and closing openings that allow passage of substrates. With this construction, the shutter mechanisms are normally closed, and are opened only when the main transport mechanism transfers substrates to or from the substrate rests. This minimizes adverse influences of the atmosphere flowing in.

It is also preferable to provide the substrate rests with a cooling device for cooling the substrates placed thereon. This construction can cool the substrates to and maintain the substrate at an appropriate temperature while the substrates stand by on the substrate rests, thereby to improve the quality of substrate treatment.

In this invention, it is not absolutely necessary to fix the substrate rests, but each substrate rest may have a horizontal moving device horizontally movable toward the main transport mechanism. With this construction, each substrate rest is horizontally movable to move a substrate to a transfer position, and thus the main transport mechanism may be moved horizontally over a reduced distance. This lightens restrictions on the construction or arrangement of the main transport mechanisms.

Each main transport mechanism may have a single holding arm for holding a substrate but, preferably, has at least two holding arms. This construction realizes an efficient substrate transfer, and allows the holding arms to be used separately according to the types of the substrate rests and treating modules. Thus, the substrates are free from adverse thermal influences of and contamination by the holding arms.

Preferably, the main transport mechanism is arranged, when transferring substrates to and from one of the inlet substrate rests and one of the outlet substrate rests, with one of the holding arms holding a substrate, and the other holding arm unloaded, to drive the one of the holding arms and transfer the substrate to the one of the outlet substrate rests, and thereafter to drive one of the holding arms, both now unloaded, and receive a different substrate from the one of the inlet substrate rests. After one of the holding arms places the substrate on one of the outlet substrate rests, the two holding arms of the main transport mechanism are empty. The following advantage results from having the two holding arms of the main transport mechanism temporarily empty. When, for example, trouble has occurred with a certain treating module in a treating block (or controlled unit), the main transport mechanism with the two holding arms empty may be moved toward this treating module to transport substrates to a location of temporary storage. If the other, empty holding arm first receives a substrate and the one holding arm thereafter passes the substrate to the substrate rest, a substrate is constantly present on either one of the holding arms. It is thus difficult to transport substrates for temporary storage in time of trouble as noted above.

Preferably, the main transport mechanism has at least two holding arms for holding the substrates, and the main transport mechanism is arranged, when transferring substrates to and from one of the inlet substrate rests and one of the outlet substrate rests, with one of the holding arms holding a substrate, and the other holding arm unloaded, to drive the one of the holding arms and transfer the substrate to the one of the outlet substrate rests, thereafter to determine whether an abnormality has occurred with a destination forward or backward with respect to a direction of transport through one of the treating blocks or controlled units in which the main transport mechanism is disposed, and when an abnormality is confirmed, to transport the substrates only in a direction free from the abnormality. With this construction, after transferring the substrate from one of the holding arms to one of the outlet substrate rests, it is determined whether an abnormality has occurred with a destination forward or backward with respect to a direction of transport through the treating block or controlled unit in which the main transport mechanism is disposed. When an abnormality has occurred, substrates are transported only in a direction opposite to the forward or backward direction encumbered by the abnormality. Thus, substrates may be transported smoothly in the direction free from the abnormality to realize an efficient substrate transport.

It is also preferred that the treating modules include heat-treating modules having heating plates for heating the substrates and cooling plates for cooling the substrates, and the main transport mechanism is arranged to drive one of the at least two holding arms in unloaded state to receive a different substrate from one of the inlet substrate rests, to fulfill a condition that, in every transport cycle, the same one of the at least two holding arms receives substrates heated by the heating plates. This construction can assign the task of receiving substrates heated by the heating plates exclusively to one of the holding arms. Thus, the other holding arm is freed from an accumulation of heat, thereby avoiding thermal influences on the substrate held by the other holding arm.

It is also preferred that, when the feed inlet substrate rest and the return inlet substrate rest both have substrates placed thereon, the main transport mechanism receives the substrate from the return inlet substrate rest by priority. Where, for example, the substrate treating apparatus according to this invention is designed to form and develop photoresist film on substrates and an exposing apparatus is connected to this substrate treating apparatus, the return inlet substrate rest receives a substrate exposed in the exposing apparatus. Where a chemically amplified photoresist is used, the exposed substrate needs to be heated promptly. In such a case, with the main transport mechanism receiving the substrate from the return inlet substrate rest by priority, the exposed substrate may be given the required treatment promptly, thereby stabilizing the quality of substrate treatment.

It is further preferred in the above construction that the main transport mechanism has at least two holding arms for holding the substrates, and the main transport mechanism is arranged, when transferring substrates to and from the feed inlet substrate rest and the return outlet substrate rest, with one of the holding arms holding a substrate, and the other holding arm unloaded, to drive the one of the holding arms and transfer the substrate to the return outlet substrate rest, thereafter to determine whether the return inlet substrate rest has a substrate placed thereon, when no substrate is found, to drive one of the holding arms in unloaded state and receive a different substrate from the feed inlet substrate rest, and when a substrate is found on the return inlet substrate rest, to move toward the return inlet substrate rest, without receiving the substrate from the feed inlet substrate rest, and with all the holding arms in unloaded state, and receive the substrate from the return inlet substrate rest for a predetermined transport process. With this construction, after transferring the substrate from one of the holding arms to the return outlet substrate rests, it is determined whether the return inlet substrate rest has a substrate placed thereon. When a substrate is found on the return inlet substrate rest, the main transport mechanism moves toward the return inlet substrate rest, with all the holding arms in unloaded state, for a predetermined transport process. Thus, the substrate is not left on the return inlet substrate rest for a long time. Where a chemically amplified photoresist is used as noted above, the quality of substrate treatment may be further improved.

Preferably, the unit control device is connected to a main control device for performing an overall control thereof, the main control device being constructed to communicate with a host computer separate from the substrate treating apparatus. With this construction, the main control device performs an overall control of information on the respective controlled units possessed by the unit control device which controls the substrate transport in each controlled unit independently of other unit control devices. The main control device communicates this control information to the host computer. Thus, the state of each controlled unit of the substrate treating apparatus may be grasped easily at the host computer.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

FIG. 11 is a view showing flows of wafer transport by first to fourth main transport mechanisms;

DESCRIPTION OF THE PREFERRED EMBODIMENTS

A preferred embodiment of this invention will be described in detail hereinafter with reference to the drawings.

Figure 1:
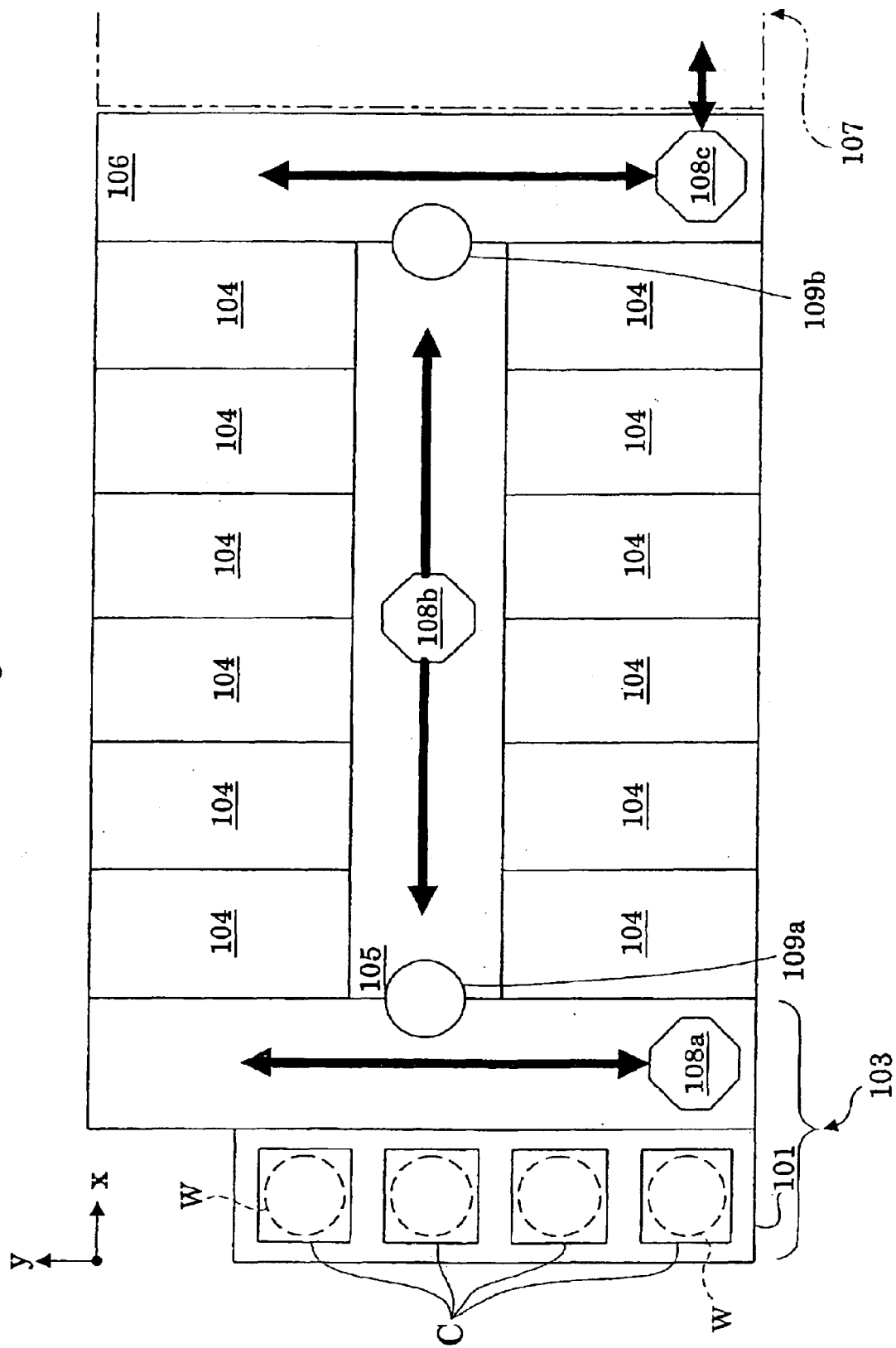
FIG. 1 is a plan view showing the construction of a conventional substrate treating apparatus.
Figure 2:
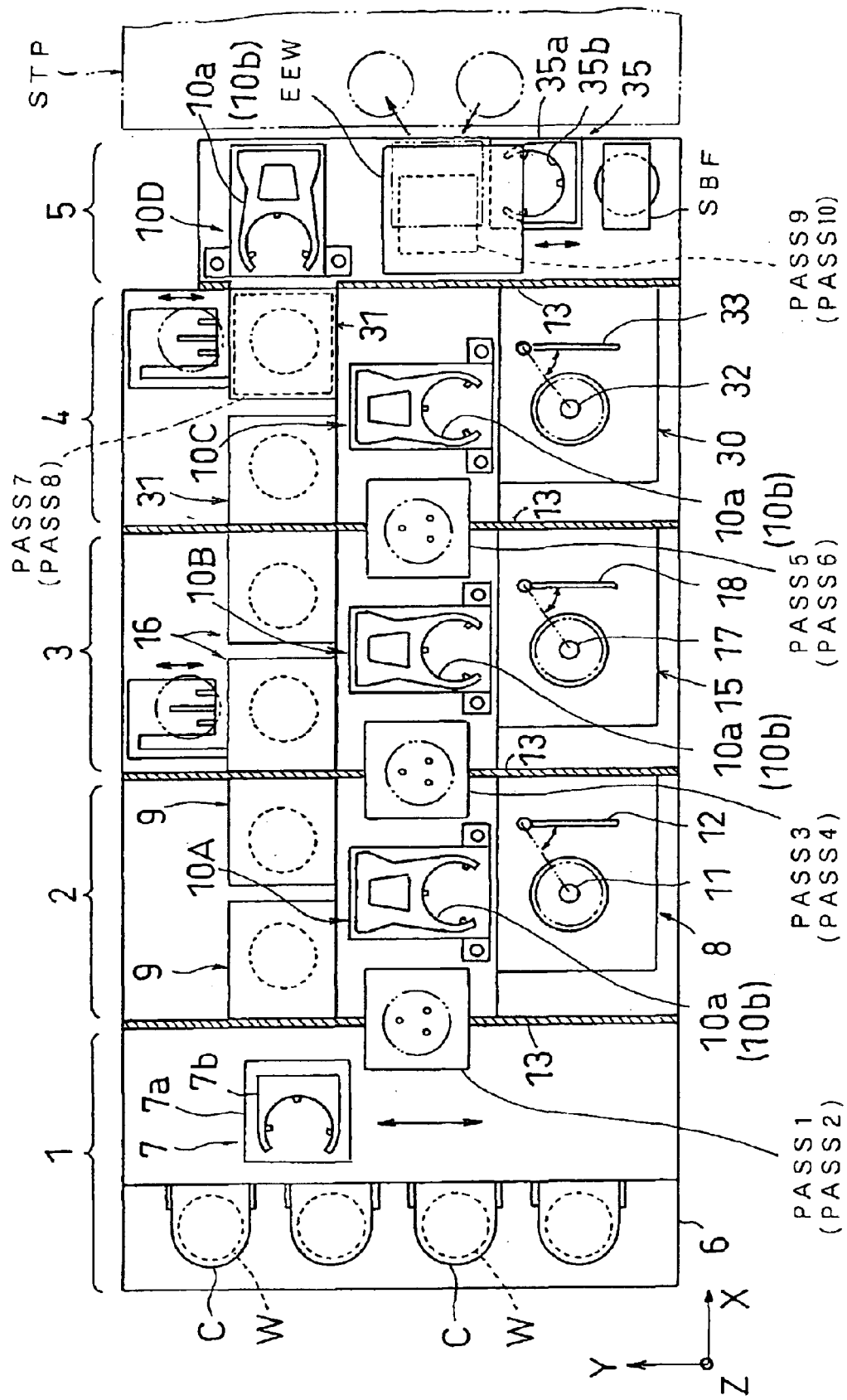
FIG. 2 is a plan view showing an outline of a substrate treating apparatus according to this invention.
Figure 3:
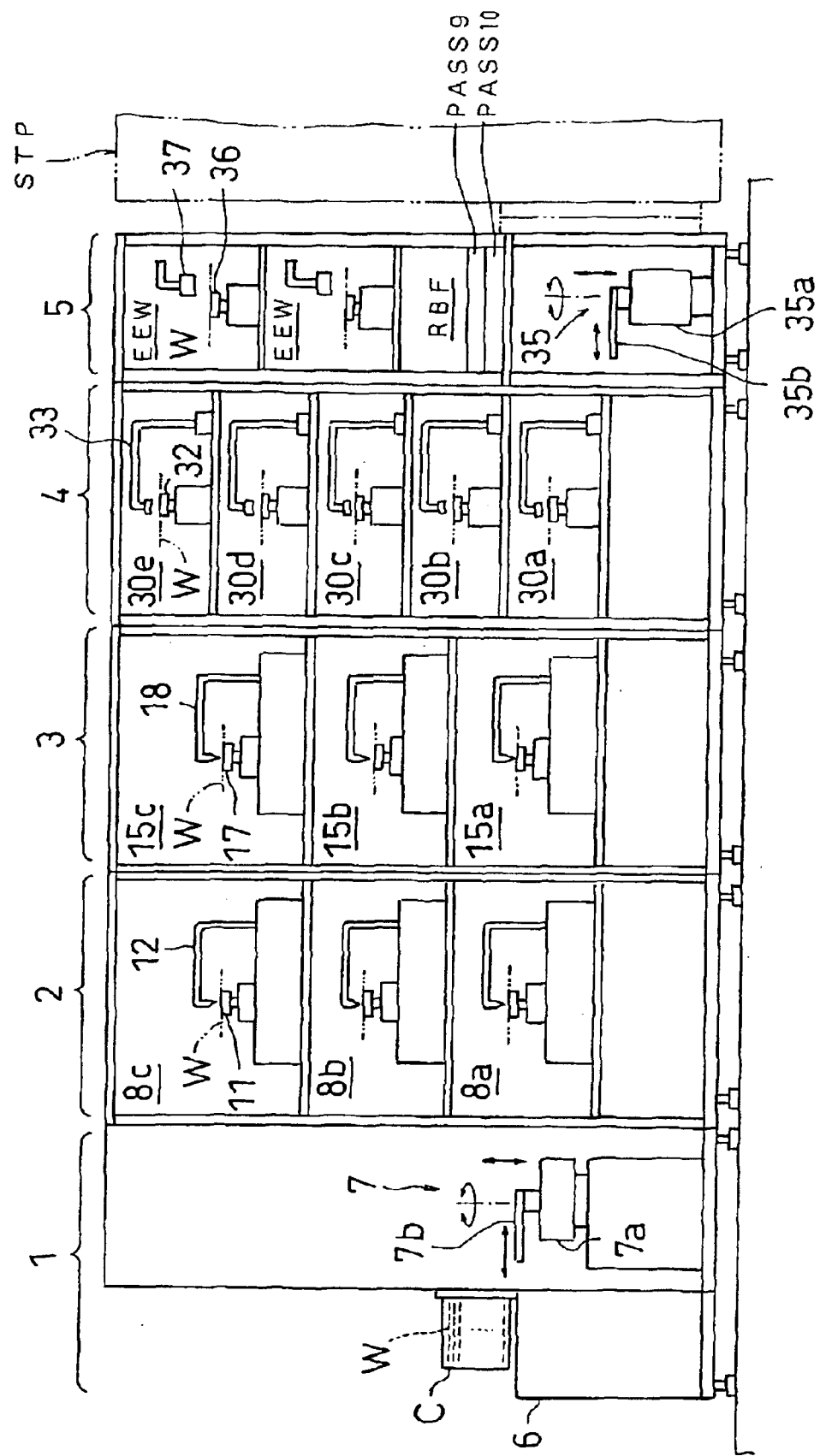
FIG. 3 is a front view showing an outline of the substrate treating apparatus according to this invention.
Figure 4:
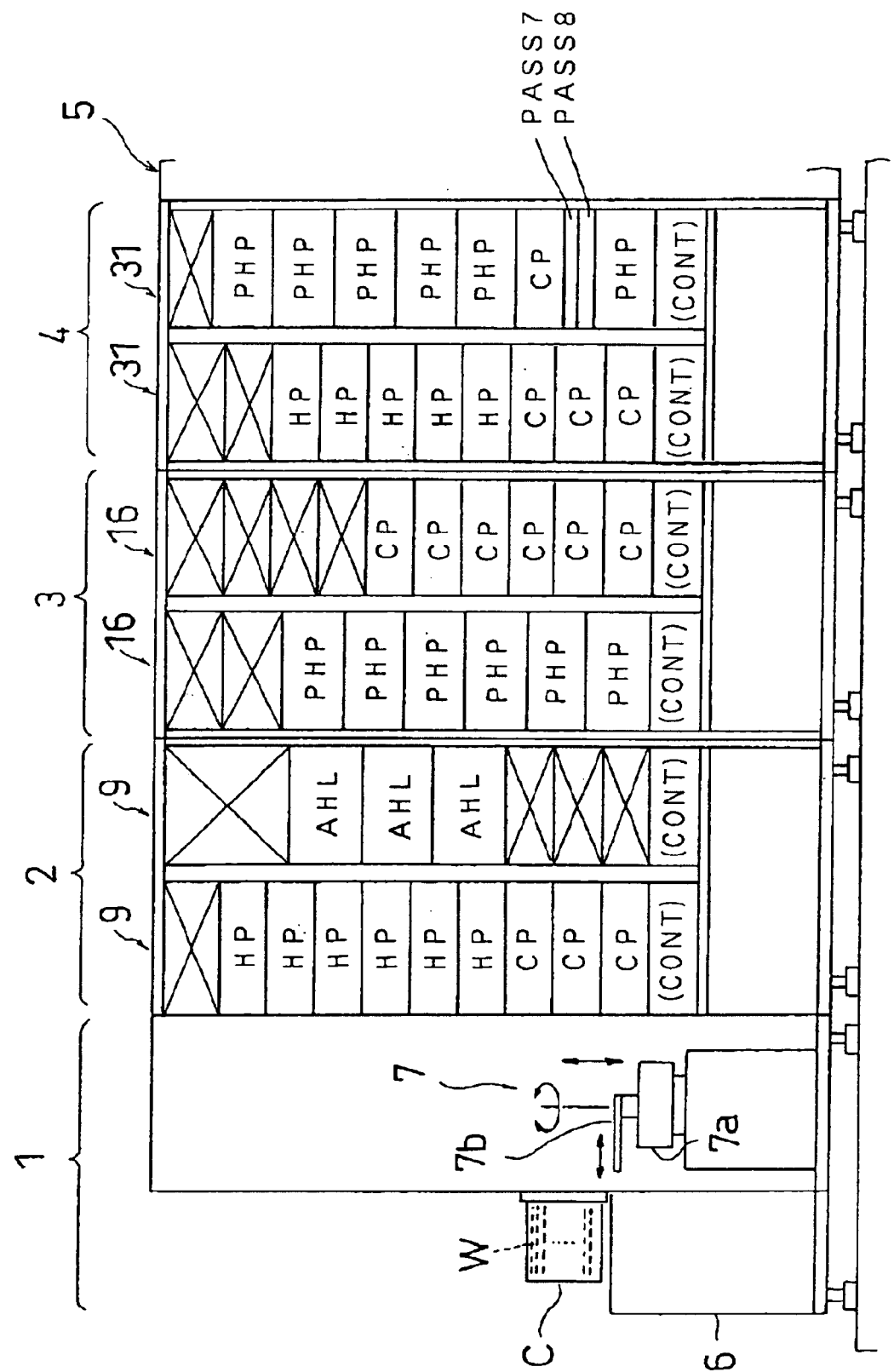
FIG. 4 is a front view of heat-treating modules.

FIG. 2 is a plan view showing an outline of a substrate treating apparatus according to this invention. FIG. 3 is a front view of the apparatus. FIG. 4 is a front view of heat-treating modules.

This substrate treating apparatus is constructed to perform chemical treatment for forming antireflection film and photoresist film on semiconductor wafers (hereinafter called simply "substrates or wafers"), and developing exposed substrates. The substrates handled by the substrate treating apparatus according to this invention are, of course, not limited to semiconductor wafers, but include various substrates such as glass substrates for liquid crystal displays. The chemical treatment is not limited to formation of photoresist film or the like or development, but includes various other chemical treatments.

FIG. 2 refers. The substrate treating apparatus in this embodiment, broadly, includes an indexer block 1, three treating blocks for performing required chemical treatments on the substrates (specifically, an antireflection film forming block 2, a resist film forming block 3 and a developing block 4), and an interface block 5. These blocks are arranged side by side. The interface block 5 communicates with an exposing apparatus (e.g. stepper) STP which is an external apparatus separate from the substrate treating apparatus in this embodiment. The construction of each block will be described hereinafter.

The indexer block 1 will be described first. The indexer block 1 is a mechanism for fetching wafers W from cassettes C each for containing a plurality of wafers W in multiple stages, and depositing wafers W in the cassettes C. Specifically, the indexer block 1 includes a cassette table 6 for receiving a plurality of cassettes C in juxtaposition, and an indexer's transport mechanism 7 for successively fetching wafers W to be treated from each cassette C, and successively depositing treated wafers W in each cassette C. The transport mechanism 7 has a movable base 7a for horizontal movement (in Y-direction) along the cassette table 6. A holding arm 7b is mounted on the movable base 7a for holding a wafer W in horizontal posture. On the movable base 7a, the holding arm 7b is vertically movable (in Z-direction), swingable in a horizontal plane, and extendible and retractable radially of the swinging movement.

Figure 5:
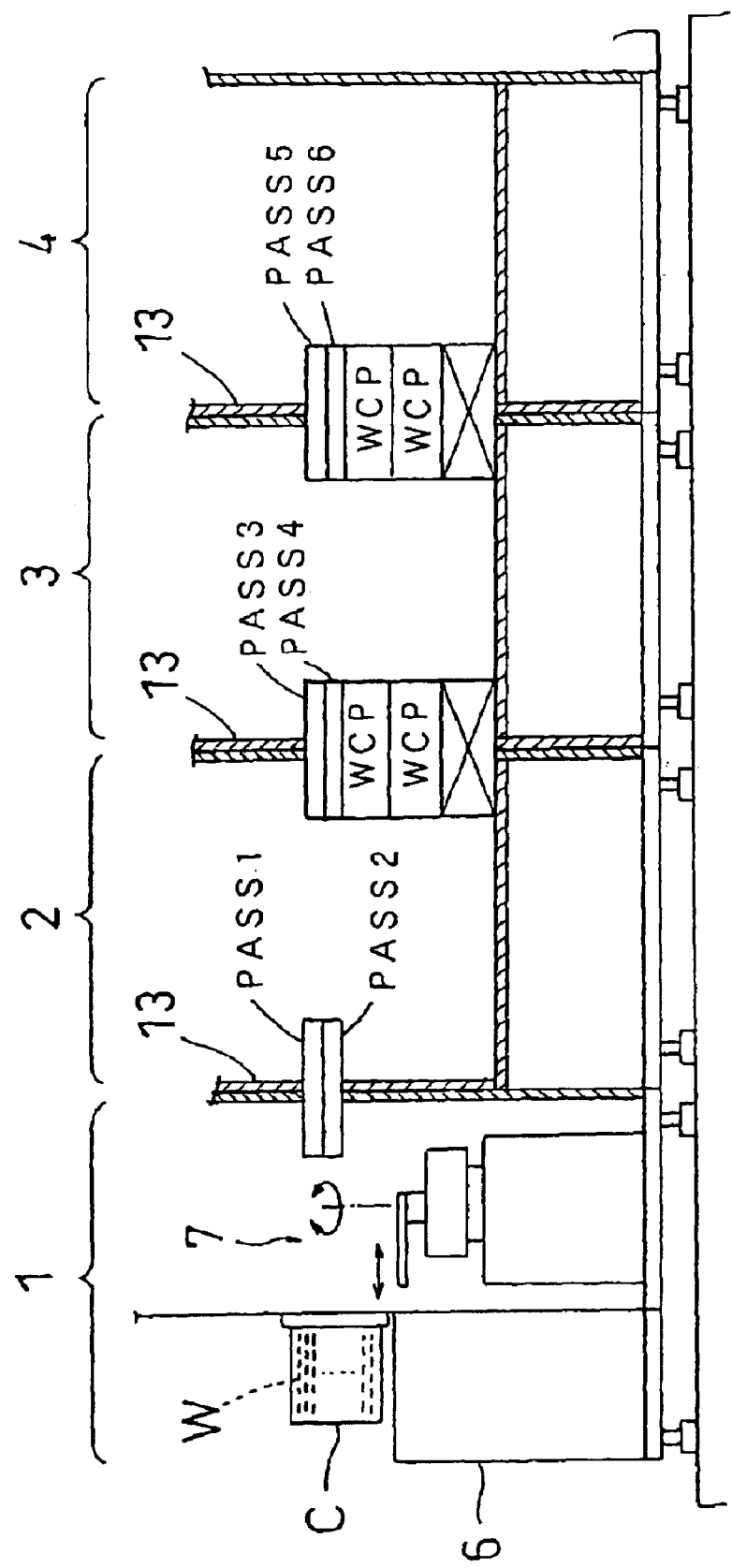
FIG. 5 is a sectional front view showing arrangements around substrate rests provided on partitions.

The antireflection film forming block 2 is disposed adjacent the indexer block 1. As shown in FIG. 5, an atmosphere shielding partition 13 is formed between the indexer block 1 and antireflection film forming block 2. The partition 13 has two substrate rests PASS1 and PASS2 arranged one over the other and close to each other for receiving wafers W to be transferred between the indexer block 1 and antireflection film forming block 2.

The upper substrate rest PASS1 is used to feed wafers W from the indexer block 1 to the antireflection film forming block 2. The lower substrate rest PASS2 is used to return wafers W from the antireflection film forming block 2 to the indexer block 1. As seen from the antireflection film forming block 2, the substrate rest PASS1 corresponds to an inlet substrate rest for letting wafers W into the antireflective film forming block 2. Particularly where the transport direction of wafers W from the indexer block 1 toward the exposing apparatus STP is regarded as a forward direction, the substrate rest PASS1 corresponds to a feed inlet substrate rest used for transporting wafers W in the forward direction. On the other hand, the substrate rest PASS2 is an outlet substrate rest for letting wafers W out of the antireflective film forming block 2, and in particular corresponds to a return outlet substrate rest used for transporting wafers W in a backward direction (in this embodiment, the transport direction of wafers W from the exposing apparatus STP toward the indexer block 1).

The substrate rests PASS1 and PASS2 partially extend through the partition 13. Each of the substrate rests PASS1 and PASS2 has a plurality of fixed support pins. This is the case also with other substrate rests PASS3–PASS10 to be described hereinafter. The substrate rests PASS1 and PASS2 include optical sensors, not shown, for detecting wafers W. A detection signal of each sensor is used for determining whether the substrate rest PASS1 or PASS2 is in a state for transferring a wafer W to or from the indexer's transport mechanism 7 or a first main transport mechanism 10A, to be described hereinafter, of the antireflection film forming block 2. Similar sensors are provided for the other substrate rests PASS3–PASS10 also.

The antireflection film forming block 2 will be described. The antireflection film forming block 2 is a mechanism for forming antireflection film under photoresist film in order to reduce standing wave and halation occurring in time of exposure. Specifically, this block 2 includes antireflection film coating modules 8 for coating the surfaces of wafers W with antireflection film, antireflection film heat-treating modules 9 for heat-treating the wafers W in relation to formation of the antireflection film, and the first main transport mechanism 10A for transferring the wafers W to and from the antireflection film coating modules 8 and antireflection film heat-treating modules 9.

In the antireflection film forming block 2, the coating modules 8 and heat-treating modules 9 are opposed to each other across the first main transport mechanism 10A. Specifically, the coating modules 8 are disposed in a front area of the apparatus, while the heat-treating modules 9 are disposed in a rear area of the apparatus. The other, resist film forming block 3 and developing block 4 also share the above feature of arranging the chemical treating modules and heat-treating modules in opposite areas across the main transport mechanism. In such an arrangement, the chemical treating modules and heat-treating modules are spaced away from each other, and hence a reduced chance of the chemical treating modules coming under the thermal influence of the heat-treating modules. In this embodiment, heat barriers, not shown, are formed in front of the heat-treating modules 9 to avoid the thermal influence on the antireflection film coating modules 8. Similar heat barriers are formed in the other, resist film forming block 3 and developing block 4 also.

As shown in FIG. 3, the antireflection film coating modules 8 consist of three antireflection film coating modules 8a–8c (hereafter referenced "8" where the individual coating modules are not distinguished) of the same construction arranged vertically. Each coating module 8 includes a spin chuck 11 for suction-supporting and spinning a wafer W in horizontal posture, and a nozzle 12 for supplying a coating solution to the wafer W held on the spin chuck 11 for forming antireflection film.

As shown in FIG. 4, the antireflection film heat-treating modules 9 include a plurality of heating plates HP for heating wafers W to a predetermined temperature, a plurality of cooling plates CP for cooling the heated wafers W to room temperature, and a plurality of adhesion modules AHL for heat-treating the wafers W in an atmosphere of HMDS (hexamethyldisilazane) vapor in order to promote adhesion of the resist film to the wafers W. These heat-treating modules 9 further include heater controllers (CONT) arranged in lower positions, and piping, wiring and reserve spaces allocated to upper positions (indicated by "X" mark in FIG. 4).

In the antireflection film heat-treating modules 9, these heat-treating modules HP, CP and AHL are stacked vertically, and the group of heat-treating modules is divided into a plurality of (two in this embodiment) columns standing side by side. The other, resist film forming block 3 and developing block 4 also share the above feature of the chemical treating modules arranged vertically and the group of vertically stacked heat-treating modules being divided into a plurality of columns.

The vertical arrangements of the chemical treating modules and the heat-treating modules in each of the treating blocks 2–4 have the effect of reducing the space occupied by the substrate treating apparatus. The group of vertically stacked heat-treating modules being divided into a plurality of columns provides the advantages of facilitating maintenance of the heat-treating modules, and eliminating the need to extend to a great height, ducting, piping and power supply lines required for the heat-treating modules.

The first main transport mechanism 10A will be described. The first main transport mechanism 10A has the same construction as the second, third and fourth main transport mechanisms 10B, 10C and 10D in the other, resist film forming block 3, developing block 4 and interface block 5. The first to fourth main transport mechanisms 10A–10D will be referred to hereinafter as the main transport mechanism(s) 10 where these transport mechanisms are not distinguished.

Figure 7A:
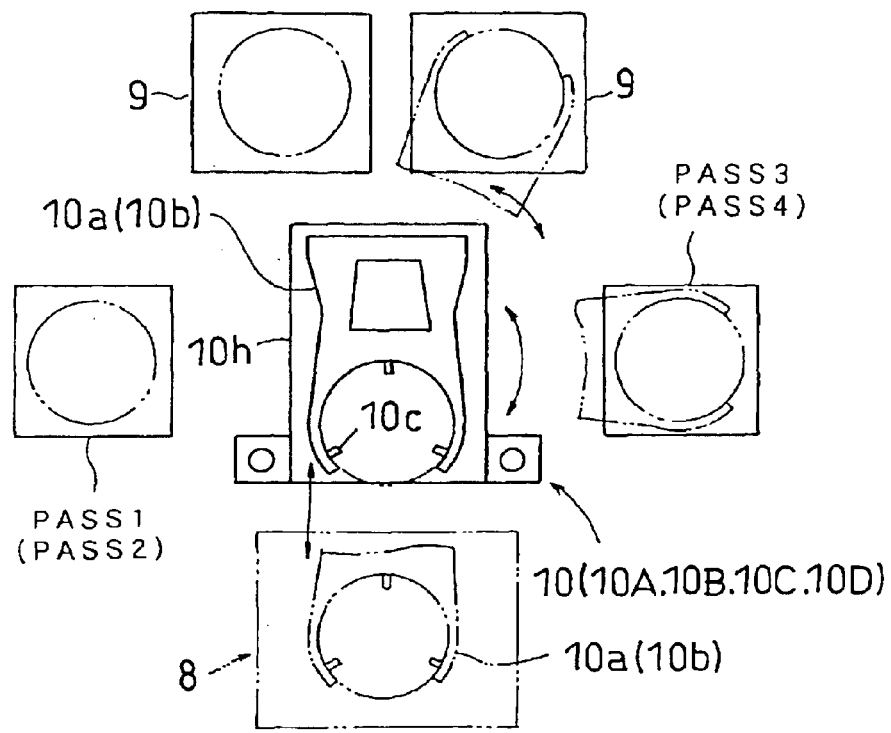
FIG. 7A is a plan view showing an outline of a main transport mechanism.
Figure 7B:
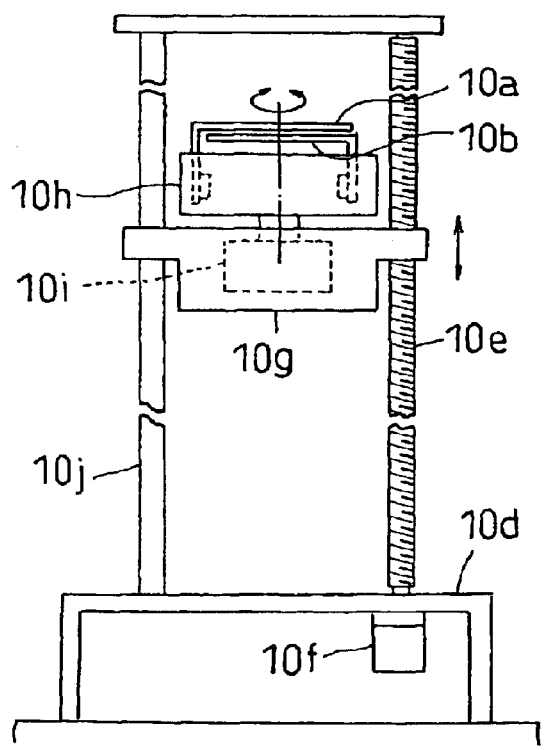
FIG. 7B is a front view showing an outline of the main transport mechanism.

Reference is made to FIGS. 7A and 7B. FIG. 7A is a plan view of the main transport mechanism 10. FIG. 7B is a front view thereof. The main transport mechanism 10 includes two holding arms 10a and 10b arranged vertically and close to each other for holding wafers W in horizontal posture. Each holding arm 10a or 10b has a forward end C-shaped in plan view, and a plurality of pins 10c projecting inwardly from inside the C-shaped end for supporting peripheries of wafer W from below. The main transport mechanism 10 has a base 10d fixed to a base of the apparatus. The base 10d rotatably supports a screw shaft 10e extending upward. A motor 10f is attached to the base 10d for rotating the screw shaft 10e. A lift deck 10g is meshed with the screw shaft 10e. When the motor 10f rotates the screw shaft 10e, the lift deck 10g moves vertically as guided by a guide rod 10j. An arm base 10h is mounted on the lift deck 10g to be rotatable about a vertical axis. A motor 10i is mounted in the lift deck 10g for rotating the arm base 10h. The two holding arms 10a and 10b noted above are arranged vertically on the arm base 10h. The holding arms 10a are 10b are extendible and retractable radially of rotation of the arm base 10h and independently of each other by drive mechanisms (not shown) mounted in the arm deck 10h.

The resist film forming block 3 is disposed adjacent the antireflection film forming block 2 described above. As shown in FIG. 5, an atmosphere shielding partition 13 is formed also between the antireflection film forming block 2 and resist film forming block 3. This partition 13 has two substrate rests PASS3 and PASS4 arranged one over the other and close to each other for receiving wafers W to be transferred between the antireflection film forming block 2 and resist film forming block 3.

As are the substrate rests PASS1 and PASS2, the upper substrate rest PASS3 is used to feed wafers W and the lower substrate rest PASS4 to return wafers W. The substrate rests PASS3 and PASS4 partially extend through the partition 13. The substrate rest PASS3 corresponds to a feed outlet substrate rest as seen from the antireflection film forming block 2, and to a feed inlet substrate rest as seen from the resist film forming block 3. The substrate rest PASS4 corresponds to a return inlet substrate rest as seen from the antireflection film forming block 2, and to a return outlet substrate rest as seen from the resist film forming block 3. Two water-cooled cooling plates WCP extend through the partition 13 under the substrate rests PASS3 and PASS4 for cooling the wafers W in a general or broad way.

The resist film forming block 3 will be described. The resist film forming block 3 is a mechanism for forming photoresist film over the antireflection film formed on the wafers W. This embodiment uses a chemically amplified resist as photoresist. The resist film forming block 3 includes resist film coating modules 15 for applying and forming photoresist film on the wafers W coated with the antireflection film, resist film heat-treating modules 16 for heat-treating the wafers W in relation to formation of the photoresist film, and the second main transport mechanism 10B for transferring the wafers W to and from the resist film coating modules 15 and resist film heat-treating modules 16.

As shown in FIG. 3, the resist film coating modules 15 consist of three resist film coating modules 15a–15c (hereafter referenced "15" where the individual coating modules are not distinguished) of the same construction arranged vertically. Each coating module 15 includes a spin chuck 17 for suction-supporting and spinning a wafer W in horizontal posture, and a nozzle 18 for supplying a coating solution to the wafer W held on the spin chuck 17 for forming resist film.

As shown in FIG. 4, the resist film heat-treating modules 16 include a plurality of heating modules PHP, with temporary substrate deposits, for heating wafers W to a predetermined temperature, and a plurality of cooling plates CP for cooling the heated wafers W to room temperature with high precision. As in the antireflection film forming block 2, these heat-treating modules are arranged vertically and in a plurality of columns.

The heating modules PHP with temporary substrate deposits will be described.

Figure 8A:
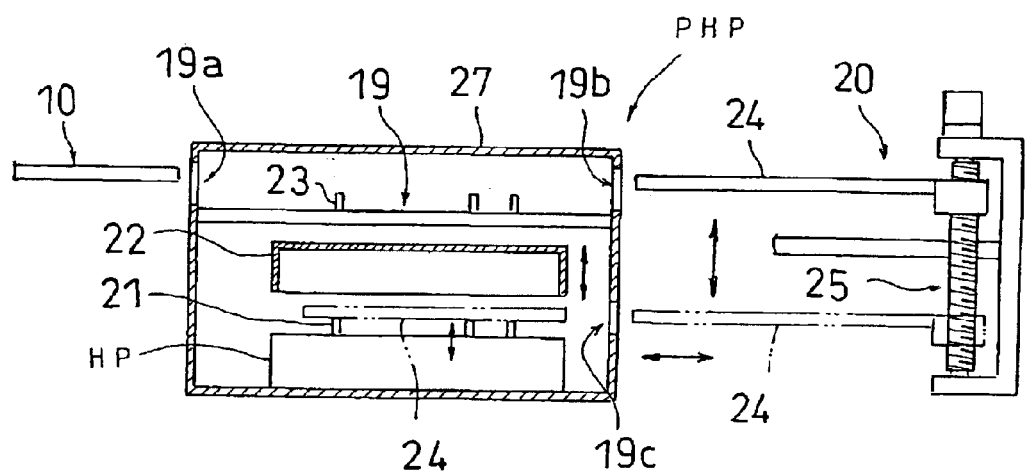
FIG. 8A is a sectional side view of a heating module with a temporary wafer deposit.
Figure 8B:
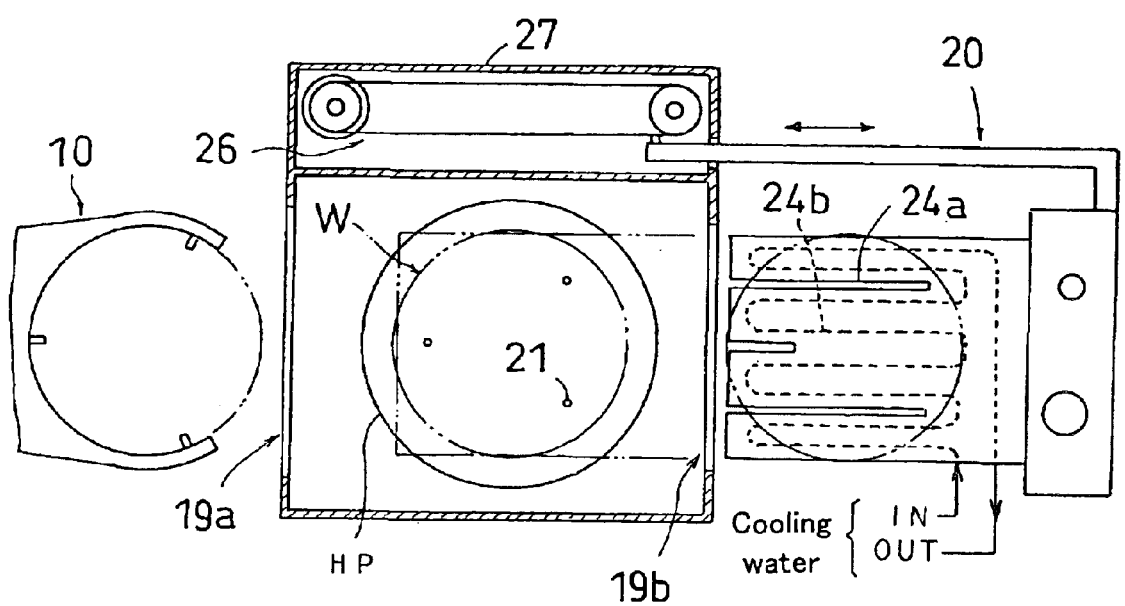
FIG. 8B is a sectional plan view of the heating module with the temporary wafer deposit.

Reference is made to FIGS. 8A and 8B. FIG. 8A is a sectional side view of one of the heating modules PHP with temporary wafer deposits. FIG. 8B is a sectional plan view thereof. The heating module PHP includes a heating plate HP for heating a wafer W placed thereon, a temporary substrate deposit 19 for keeping the wafer W in an upper position or lower position (upper position in this embodiment) away from the heating plate HP, and a local transport mechanism 20 for transporting the wafer W between the heating plate HP and temporary substrate deposit 19. The heating plate HP has a plurality of support pins 21 projectable above and retractable below the upper surface of the plate. An upper lid 22 is disposed above the heating plate HP to be vertically movable for covering the wafer W in time of heating treatment. The temporary substrate deposit 19 has a plurality of fixed support pins 23 for supporting the wafer W.

The local transport mechanism 20 includes a holding plate 24 for holding a wafer W in horizontal posture. The holding plate 24 is vertically movable by a screw feed mechanism 25, and extendible and retractable by a belt drive mechanism 26. The holding plate 24 defines a plurality of slits 24a to avoid interference with the movable support pins 21 or fixed support pins 23 when the holding plate 24 is extended over the heating plate HP or temporary substrate deposit 19. The local transport mechanism 20 includes a device for cooling a wafer W while transporting the wafer W from the heating plate HP to the temporary substrate deposit 19. This cooling device, for example, has a cooling water channel 24b formed inside the holding plate 24 for circulating cooling water.

The local transport mechanism 20 is opposed to the second main transport mechanism 10B across the heating plate HP and temporary substrate deposit 19. That is, the local transport mechanism 20 is disposed adjacent the rear surface of the apparatus. The heating plate HP and temporary substrate deposit 19 are enclosed in a housing 27. The housing 27 has an opening 19a formed in the front wall of an upper portion thereof covering the temporary substrate deposit 19 for allowing entry of the second main transport mechanism 10B and an opening 19b formed in the rear wall of the upper portion for allowing entry of the local transport mechanism 20. Further, the housing 27 has a closed front surface in a lower portion thereof covering the heating plate HP, and an opening 19c formed in the rear wall of the lower portion for allowing entry of the local transport mechanism 20.

A wafer W is loaded into and unloaded from the above heating module PHP as follows. First, the main transport mechanism 10 (the second main transport mechanism 10B in the case of the resist film forming block 3) places a wafer W on the fixed support pins 23 of temporary substrate deposit 19. Then, the holding plate 24 of the local transport mechanism 20 advances under the wafer W and slightly ascends to pick up the wafer W from the fixed support pins 23. The holding plate 24 holding the wafer W leaves the housing 27, and descends to a position opposed to the heating plate HP. At this time, the movable support pins 21 of the heating plate HP are in the lowered position, and the upper lid 22 is raised. The holding plate 24 holding the wafer W advances over the heating plate HP. The movable support pins 21 are raised to pick up the wafer W, and thereafter the holding plate 24 leaves the housing 27. Then, the movable support pins 21 are lowered to lay the wafer W on the heating plate HP. The upper lid 22 is lowered to cover the wafer W. The wafer W is heated in this state. After the heating treatment, the upper lid 22 is raised. The movable support pins 21 are raised to pick up the wafer W. The holding plate 24 advances under the wafer W, and then the movable support pins 23 are lowered to lay the wafer W on the holding plate 24. The holding plate 24 holding the wafer W leaves the housing 27, moves up and transports the wafer W into the temporary substrate deposit 19. The wafer W supported by the holding plate 24 inside the temporary substrate deposit 19 is cooled by the cooling function of the holding plate 24. The holding plate 24 transfers the cooled (i.e. returned to room temperature) wafer W onto the fixed support pins 23 in the temporary substrate deposit 19. The main transport mechanism 10 takes out and transports the wafer W.

As described above, the main transport mechanism 10 transfers wafers W to and from the temporary substrate deposit 19 only, and not to and from the heating plate HP. Thus, the main transport mechanism 10 is free from temperature increase. Further, the opening 19c for loading and unloading wafers W on/from the heating plate HP is located in the side remote from the main transport mechanism 10. Thus, the main transport mechanism 10 is not heated by the hot atmosphere escaping through the opening 19c. The resist film coating modules 15 are never subject to adverse influences of the hot atmosphere escaping through the opening 19c, either.

The developing block 4 is disposed adjacent the resist film forming block 3 described above. As shown in FIG. 5, an atmosphere shielding partition 13 is formed also between the resist film forming block 3 and developing block 4. This partition 13 has, arranged vertically, two substrate rests PASS5 and PASS6 for transferring wafers W between the two blocks 3 and 4, and two water-cooled cooling plates WCP for cooling the wafers W in a general or broad way. The substrate rest PASS5 corresponds to a feed outlet substrate rest as seen from the resist film forming block 3, and to a feed inlet substrate rest as seen from the developing block 4. The substrate rest PASS6 corresponds to a return inlet substrate rest as seen from the resist film forming block 3, and to a return outlet substrate rest as seen from the developing block 4.

The developing block 4 will be described. The developing block 4 is a mechanism for developing exposed wafers W. Specifically, the developing block 4 includes developing modules 30 for developing exposed wafers W, heat-treating modules 31 for heat-treating the wafers W in relation to development, and the third main transport mechanism 10C for transferring the wafers W to and from the developing modules 30 and heat-treating modules 31.

As shown in FIG. 3, the developing modules 30 consist of five developing modules 30a–30e (hereafter referenced "30"

where the individual developing modules are not distinguished) of the same construction arranged vertically. Each developing module 30 includes a spin chuck 32 for suction-supporting and spinning a wafer W in horizontal posture, and a nozzle 33 for supplying a developer to the wafer W held on the spin chuck 32.

As shown in FIG. 4, the heat-treating modules 31 include a plurality of heating plates HP, a plurality of heating modules PHP with temporary substrate deposits, and a plurality of cooling plates CP. As in the other blocks 2 and 3, these heat-treating modules are arranged vertically and in a plurality of columns. The right-hand column (adjacent the interface block 5) of heat-treating modules 31 includes substrate rests PASS7 and PASS8 arranged one over the other and close to each other for transferring wafers W to and from the interface block 5. The upper substrate rest PASS7 is used to feed wafers W and the lower substrate rest PASS8 to return wafers W. The substrate rest PASS7 corresponds to a feed outlet substrate rest as seen from the developing block 4, and to a feed inlet substrate rest as seen from the interface block 5. The substrate rest PASS8 corresponds to a return inlet substrate rest as seen from the resist developing block 4, and to a return outlet substrate rest as seen from the interface block 5.

The interface block 5 will be described. The interface block 5 is a mechanism for transferring wafers W to and from the exposing apparatus STP which is an external apparatus separate from the substrate treating apparatus. The interface block 5 in this embodiment includes, besides an interface's transport mechanism 35 for transferring wafers W to and from the exposing apparatus STP, two edge exposing modules EEW for exposing peripheries of wafers W coated with photoresist, and the fourth main transport mechanism 10D for transferring wafers W to and from the edge exposing modules EEW and the heat-treating modules PHP with temporary substrate deposits arranged in the developing block 4.

As shown in FIG. 3, each edge exposing module EEW includes a spin chuck 36 for suction-supporting and spinning a wafer W in horizontal posture, and a light emitter 37 for exposing peripheries of the wafer W held on the spin chuck 36. The two edge exposing modules EEW are arranged one over the other in a middle position of the interface block 5. The fourth main transport mechanism 10D disposed adjacent the edge exposing modules EEW and the heat-treating modules of the developing block 4 has the same construction as the main transport mechanism 10 illustrated in FIGS. 7A and 7B.

Figure 6:
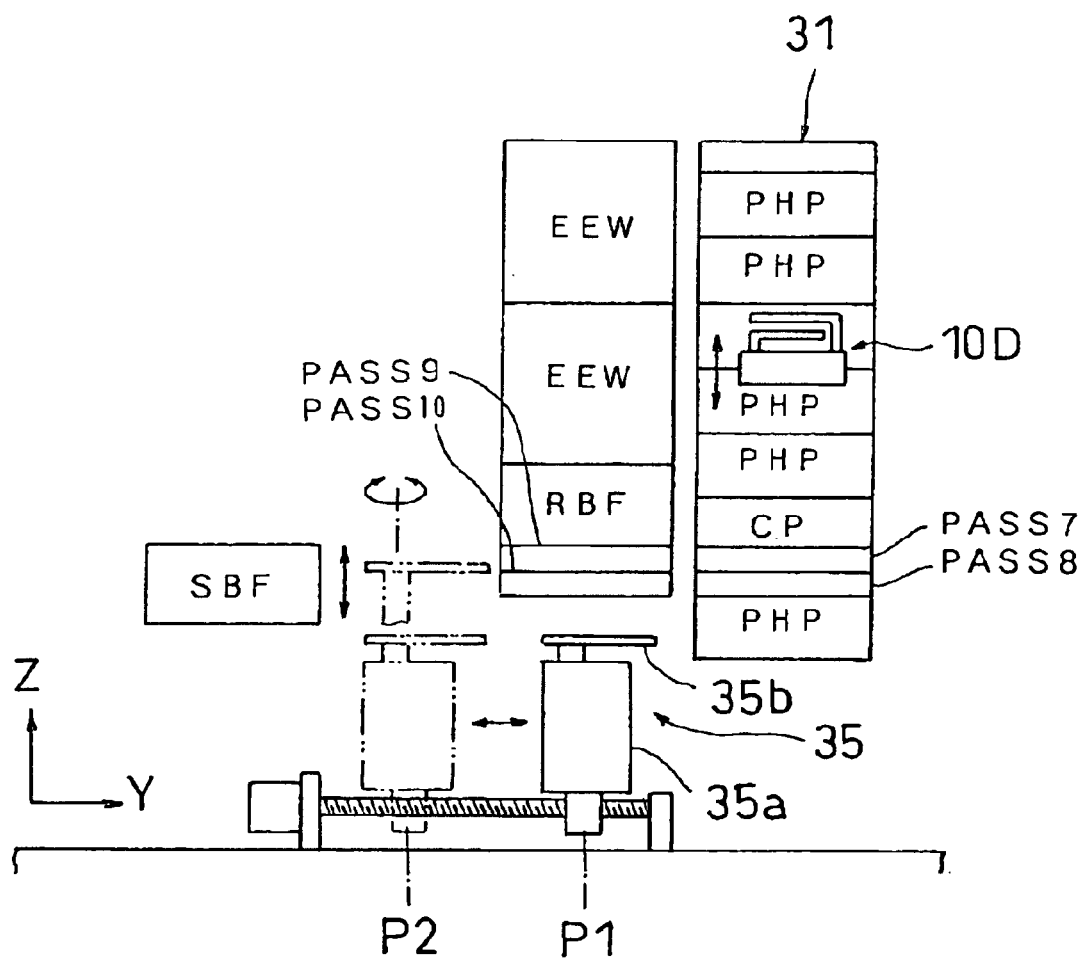
FIG. 6 is a side view showing an outline of an interface block.

Reference is made to FIGS. 3 and 6. FIG. 6 is a side view of the interface block 5. A substrate return buffer RBF is disposed below the two edge exposing modules EEW, and two substrate rests PASS9 and PASS10 are arranged one over the other, below the buffer RBF. The substrate return buffer RBF is provided for temporarily storing wafers W having undergone post-exposure heating treatment in the heating modules PHP of the developing block 4 when the developing block 4 cannot develop the wafers W due to some fault, for example. This buffer RBF is in the form of a storage rack for storing a plurality of wafers W in multiple stages. The substrate rests PASS9 and PASS10 are used for transferring wafers W between the fourth main transport mechanism 10D and interface's transport mechanism 35. The upper rest is for feeding wafers W, while the lower rest is for returning wafers W.

As shown in FIGS. 2 and 6, the interface's transport mechanism 35 has a movable base 35a for horizontal movement in Y-direction, and a holding arm 35b mounted on the movable base 35a for holding a wafer W. The holding arm 35b is vertically movable, swingable, and extendible and retractable radially of the swinging movement. The interface's transport mechanism 35 has one end (position P1 shown in FIG. 6) of its transport path extending under the substrate rests PASS9 and PASS10 arranged vertically. In the position P1, the interface's transport mechanism 35 transfers wafers W to and from the exposing apparatus STP. In the other end position P2 of the transport path, the interface's transport mechanism 35 transfers wafers W to and from the substrate rests PASS9 and PASS10, and deposits and fetches wafers W to/from a feed buffer SBF. The feed buffer SBF is provided for temporarily storing wafers W to be exposed, when the exposing apparatus STP cannot accept the wafers W, and is in the form of a storage rack for storing a plurality of wafers W in multiple stages.

The substrate treating apparatus having the above construction feeds downflows of clean air into the indexer block 1, respective treating blocks 2, 3 and 4 and interface block 5 to avoid adverse influences on the processes exerted by floating particles and air currents in these blocks. The interior of each block is maintained at a slightly higher pressure than external environment of the apparatus to prevent entry of particles, contaminants and the like from the external environment. The antireflection film forming block 2, in particular, is set to a higher atmospheric pressure than the indexer block 1. Since the atmosphere in the indexer block 1 does not flow into the antireflection film forming block 2, the treating processes may be carried out in the respective blocks 2, 3 and 4 without being influenced by external atmosphere.

A control system, particularly controls of substrate transport, of the substrate treating apparatus in this embodiment will be described next.

Figure 9A:
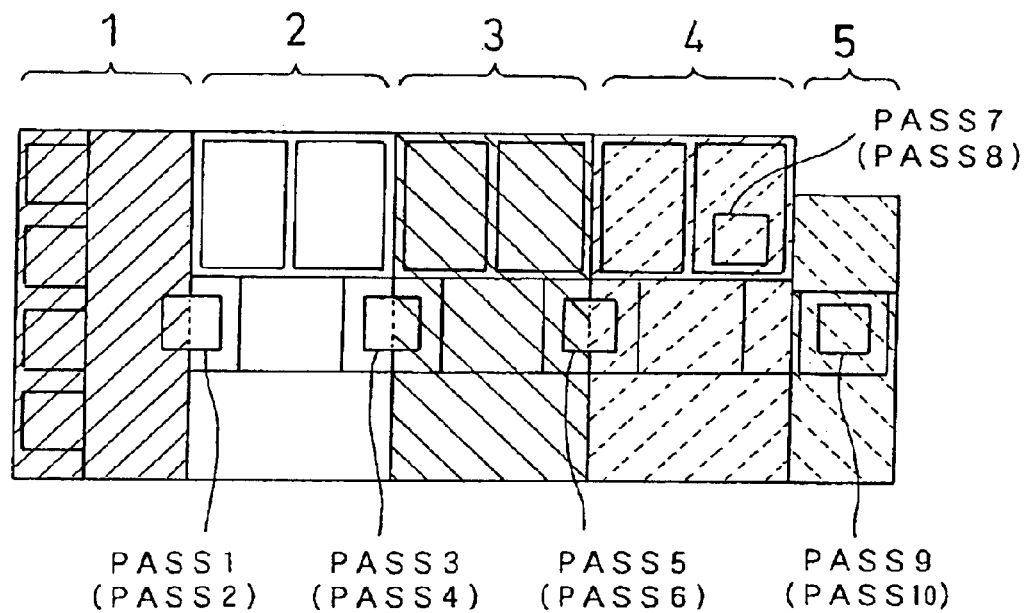
FIG. 9A is a plan view showing an arrangement of blocks in the apparatus according to the invention.

The indexer block 1, antireflection film forming block 2, resist film forming block 3, developing block 4 and interface block 5 described above are components resulting from a mechanical division of the substrate treating apparatus. Specifically, the substrate treating apparatus is formed by assembling the respective blocks to individual block frames and connecting the block frames together (see FIG. 9A).

On the other hand, as one of the features of this invention, controlled units relating to substrate transport are provided separately from the blocks constituting the mechanical components. That is, each single controlled unit includes treating modules for performing required treatment of substrates, and a single main transport mechanism for transferring the substrates to and from the treating modules. Such controlled units are juxtaposed to form the substrate treating apparatus. Each controlled unit has, provided separately from each other, an inlet substrate rest on which substrates are placed to be received by the controlled unit, and an outlet substrate on which substrates are placed to be delivered from the controlled unit. The main transport mechanisms of the respective controlled units transfer substrates through the inlet substrate rests and outlet substrate rests, and each controlled unit includes a unit control device for controlling at least the substrate transfer operation of the main transport mechanism of each controlled unit. Each unit control device performs, independently of the other control devices, a series of controls relating to substrate transport including transfer of substrates to and from the treating modules and transfer of substrates to and from the substrate rests.

Figure 9B:
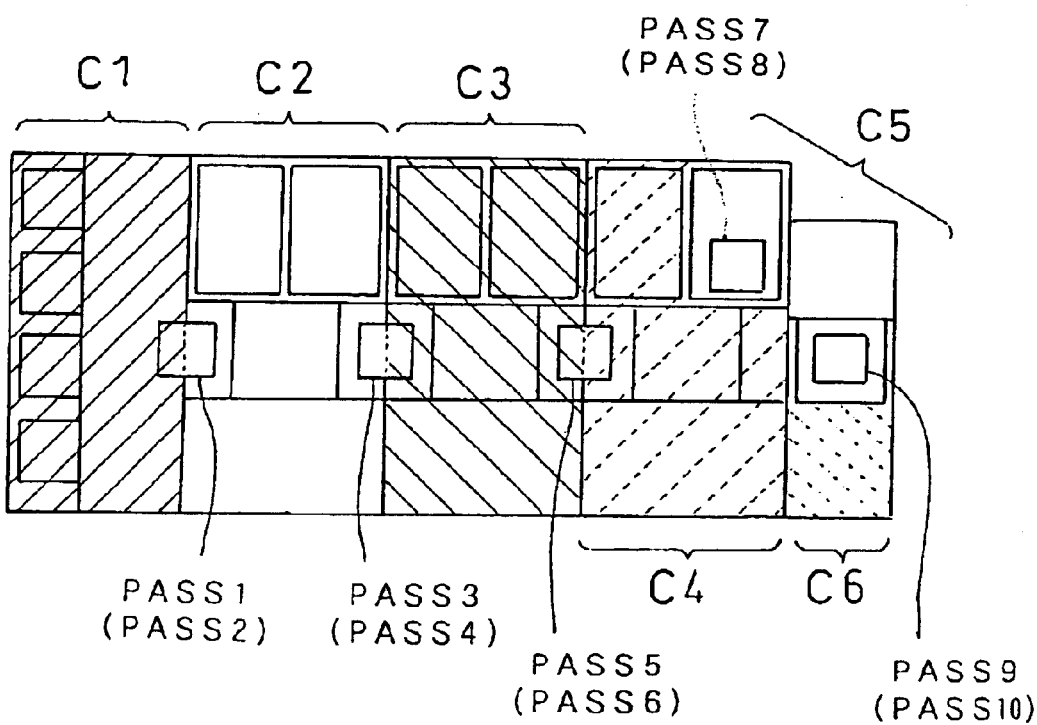
FIG. 9B is a plan view showing an arrangement of cells in the apparatus according to the invention.

The controlled units in this embodiment are hereinafter called "cells". FIG. 9B shows an arrangement of cells in this embodiment.

An indexer cell C1 includes the cassette table 6 and indexer's transport mechanism 7. Consequently, this cell C1 has the same construction as the indexer block 1 which is a component divided mechanically. An antireflection film forming cell C2 includes the antireflection film coating modules 8, antireflection film heat-treating modules 9 and first main transport mechanism 10A. Consequently, this cell C2 also has the same construction as the antireflection film forming block 2 which is a component divided mechanically. A resist film forming cell C3 includes the resist film coating modules 15, resist film heat-treating modules 16 and second main transport mechanism 10B. Consequently, this cell C3 also has the same construction as the resist film forming block 3 which is a component divided mechanically.

On the other hand, a developing cell C4 includes the developing modules 30, heat-treating modules 31 excluding the heat-treating modules (heating modules PHP in the embodiment) used for post-exposure heating, and the third main transport mechanism 10C. This cell C4 has a construction different from the developing block 4 which is a component divided mechanically, in excluding the heating modules PHP used for post-exposure heating.

A post-exposure heating cell C5 includes post-exposure heating modules (i.e. heating modules PHP arranged in the developing block 4 in the embodiment) for heating exposed wafers W before development, edge exposing modules EEW and fourth main transport mechanism 10D. This cell C5 bridges the developing block 4 and interface block 5 which are components divided mechanically, and is a characteristic cell of this embodiment. Since the post-exposure heating modules (i.e. heating modules PHP) and fourth main transport mechanism 10D are incorporated into the single cell as noted above, exposed wafers W may be loaded into the heating modules PHP promptly for heat treatment. This is advantageous where a chemically amplified photoresist is used which requires to be heated quickly after exposure.

The substrate rests PASS7 and PASS8 noted above are used in transferring wafers W between the third main transport mechanism 10C of the developing cell C4 and the fourth main transport mechanism 10D of the post-exposure heating cell C5. The substrate rest PASS7 corresponds to a feed outlet substrate rest as seen from the developing cell C4, and to a feed inlet substrate rest as seen from the post-exposure heating cell C5. The substrate rest PASS8 corresponds to a return inlet substrate rest as seen from the developing cell C4, and to a return outlet substrate rest as seen from the post-exposure heating cell C5.

An interface cell C6 includes the interface's transport mechanism 35 for transferring wafers W to and from the exposing apparatus STP which is an external apparatus. This cell C6 does not include the fourth main transport mechanism 10D or edge exposing modules EEW and, in this respect, is different from the interface block 5 which is a component divided mechanically. The substrate rests PASS9 and PASS10 noted above are used in transferring wafers W between the fourth main transport mechanism 10D of the post-exposure heating cell C5 and the interface's transport mechanism 35. The substrate rest PASS9 corresponds to a feed outlet substrate rest as seen from the post-exposure heating cell C5, and to a feed inlet substrate rest as seen from the interface cell C6. The substrate rest PASS10 corresponds to a return inlet substrate rest as seen from the post-exposure heating cell C5, and to a return outlet substrate rest as seen from the interface cell C6.

This embodiment has the above six cells C1–C6 arranged in juxtaposition. Wafers W are transferred between the cells C1–C6 through the substrate rests PASS1–PASS10. In other words, each controlled unit (cell) in this invention includes a single main transport mechanism, and treating modules to and from which the main transport mechanism transfers wafers W received from a particular one of the inlet substrate rests before placing the wafers W on a particular one of the outlet substrate rests.

Figure 10A:
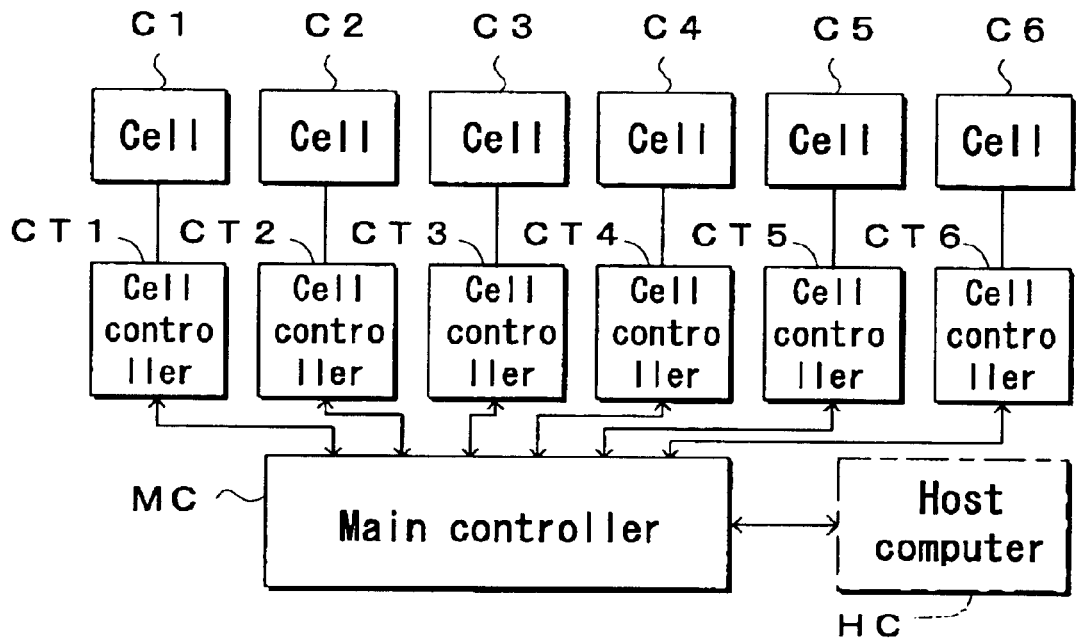
FIG. 10A is a block diagram of a control system in the apparatus according to the invention.

As shown in FIG. 10A, the cells C1–C6 individually include cell controllers (unit control devices) CT1–CT6 for controlling at least substrate transfer operations of the main transport mechanisms (including the indexer's transport mechanism 7 and interface's transport mechanism 35), respectively. Each of the cell controllers CT1–CT6 independently performs a series of controls, starting with receipt of a wafer W from a predetermined inlet substrate rest, and finishing with placement of the wafer W on a predetermined outlet substrate rest. Specifically, the cell controllers CT1–CT6 of the respective cells C1–C6 exchange information in such a way that one cell controller sends information to the cell controller of a next cell that a wafer W has been placed on a predetermined substrate rest, and the cell controller of the next cell having received the wafer W returns information to the cell controller of the preceding cell that the wafer W has been received from the predetermined substrate rest. Such exchange of information is performed through a main controller (main control device) MC connected to the respective cell controllers CT1–CT6 for performing an overall control thereof. The main controller MC is constructed to communicate with a host computer HC that controls an entire semiconductor manufacturing process involving the substrate treating apparatus in this embodiment. Substrate processing states in the respective cells C1–C6 are collected in the main controller MC through the cell controllers CT1–CT6, and transmitted to the host computer HC. Thus, the states of the respective cells C1–C6 may be grasped easily by the host computer HC.

Figure 10B:
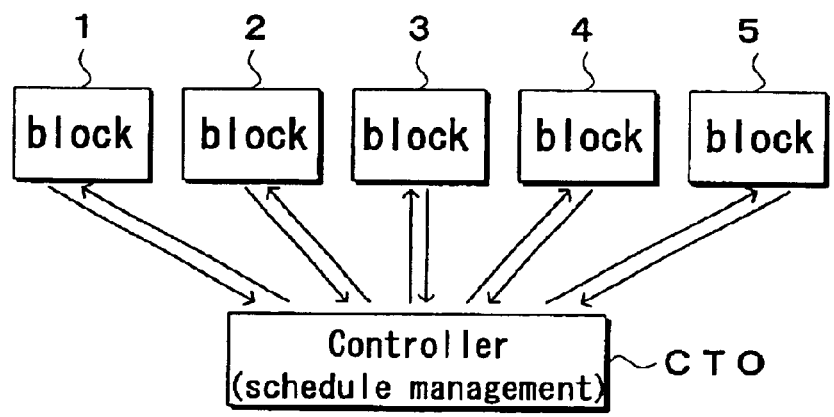
FIG. 10B is a block diagram of a control system in a conventional apparatus shown for comparison purposes.

Each of the cell controllers CT1–CT6 performs controls only for transfer of wafers W within its cell without regard to movement of the main transport mechanisms in the adjoining cells. Thus, the cell controllers CT1–CT6 operate under a reduced control load. In the control method in a conventional substrate treating apparatus, as shown in FIG. 10B, each of the blocks 1–5 transmits information relating to substrate transport to a controller CT0 for schedule management, and the controller CT0 performs an overall control of substrate transport. Thus, the controller CT0 has an increased load.

In this embodiment, the cell controllers CT1–CT6 operate under a reduced control load as described above, and thus the substrate treating apparatus has correspondingly improved throughput. In the conventional control method shown in FIG. 10B, a treating module newly added necessitates an extensive revision of the schedule management program in the controller CT0. In the control method according to this invention, a cell may be added easily since it will not influence the adjoining cells. A cell that can be added is not limited to a particular type. For example, an inspecting cell may be added between the resist film forming cell C3 and developing cell C4 for inspecting the thickness of resist film formed on wafers W or for inspecting the line width of developed resist film. In this case, the inspecting cell, as do the other cells in this embodiment, includes substrate inspecting modules for inspecting substrates, and a main transport mechanism for transporting substrates to and from the inspecting modules. The substrates are transferred between the inspecting cell and adjacent cells through inlet substrate rests and outlet substrate rests.

Where the main transport mechanism transports a wafer W from a particular location to another location, as one step, in each of the antireflection film forming cell C2, resist film forming cell C3 and the developing cell C4, the first, second and third main transport mechanisms 10A, 10B and 10C in the cells C2, C3 and C4 perform substantially the same number of transport steps. This is another feature of the substrate treating apparatus in this embodiment. While its details will be apparent from the operation of the apparatus in this embodiment described hereinafter, as shown in FIG. 11, each of the above main transport mechanisms 10A, 10B and 10C performs approximately six transport steps.

In this embodiment, the main transport mechanism 10 carries out one transport step in about four seconds. Thus, with the main transport mechanism 10 performing six transport steps, each of the cells C2–C3 discharges one wafer W every 24 seconds (i.e. in a processing cycle of 24 seconds) to the adjoining cell. That is, this apparatus can process 150 wafers W per hour. If one main transport mechanism performs more transport steps than the other main transport mechanisms, the throughput of the substrate treating apparatus is dependent on the processing cycle of the cell to which that one main transport mechanism belongs. Where, for example, each of the main transport mechanisms 10A and 10C of the cells C2 and C4 performs five transport steps, and the main transport mechanism 10B of the cell C3 performs eight transport steps, wafers W flow between the cells C2–C4 only in the processing cycle of the cell C3 (which is 32 seconds in this case). Even if the main transport mechanisms 10A and 10C of cells C2 and C4 can afford to transport more wafers W, the substrate treating apparatus can process only 112.5 wafers W per hour.

In this embodiment, on the other hand, each of the main transport mechanisms 10A, 10B and 10C of the antireflection film forming cell C2, resist film forming cell C3 and developing cell C4 shares approximately the same number of transport steps. This embodiment avoids a situation where one main transport mechanism reaches the limit of transporting process earlier than the other main transport mechanisms. As a result, the substrate treating apparatus provides improved throughput.

Regarding the post-exposure heating cell C5 disposed adjacent the developing cell C4, the fourth main transport mechanism 10D of this cell C5 is set to perform five transport steps. The post-exposure heating cell C5 requires a strict management of time from exposure to heating of wafer W. Thus, from the viewpoint of allowing elbowroom, the fourth main transport mechanism 10D is given a lighter transport load than the other main transport mechanisms. Where no such elbowroom is required for the fourth main transport mechanism 10D, this heating cell C5 will have a margin for one transport step. This transport margin may be utilized for adding a new treating module, e.g. a module for inspecting wafers W, to the post-exposure heating cell C5. Even with such a substrate inspecting module added, the main transport mechanism 10D of the cell C5 shares only six transport steps as do the main transport mechanisms of the other cells. That is, even where a substrate inspecting module is added to the cell C5 having a transport margin, the cell C5 has the same processing cycle of 24 seconds as the other cells. This results in no reduction in the throughput of the substrate treating apparatus.

Operation of the substrate treating apparatus in this embodiment will be described next. See FIG. 11 particularly for the transport steps executed by the main transport mechanisms 10A–10D of the antireflection film forming cell C2, resist film forming cell C3, developing cell C4 and post-exposure heating cell C5.

First, the indexer's transport mechanism 7 of the indexer cell C1 (indexer block 1) moves horizontally to a position opposed to a predetermined cassette C. Then, a wafer W to be treated is fetched from the cassette C by vertically moving and extending and retracting the holding arm 7b. With the wafer W held by the holding arm 7b, the indexer's transport mechanism 7 moves horizontally to the position opposed to the substrate rests PASS1 and PASS2. Then, the transport mechanism 7 places the wafer W held by the holding arm 7b on the upper, substrate feeding rest PASS1. When a treated wafer W is found on the lower, substrate returning rest PASS2, the indexer's transport mechanism 7 loads the treated wafer W on the holding arm 7b, and deposits this treated wafer W in a predetermined cassette C. Subsequently, the transport mechanism 7 repeats the operation to fetch a wafer W to be treated from the cassette C, transport the wafer W to the substrate rest PASS1, receive a treated wafer W from the substrate rest PASS2, and deposit the treated wafer W in the cassette C.

Operation of the antireflection film forming cell C2 (antireflection film forming block 2) will be described. After the wafer W to be treated is placed on the substrate rest PASS1 ("feed inlet substrate rest" as seen from the antireflection film forming cell C2), as shown in FIG. 11, the first main transport mechanism 10A of the cell C2 vertically moves and swings the holding arms 10a and 10b together to the position opposed to the substrate rests PASS1 and PASS2. The first main transport mechanism 10A performs a wafer transfer operation to place a treated wafer W held by one holding arm 10b on the lower, substrate returning rest PASS2 ("return outlet substrate rest" as seen from the antireflection film forming cell C2), and thereafter drive the now unloaded holding arm 10b again to load the wafer W to be treated from the upper, feed inlet substrate rest PASS1 on this holding arm 10b. In this way, only the holding arm 10b is used in transferring the treated wafer W and wafer W to be treated.

Specifically, the holding arm 10b is advanced to place a treated wafer W on the return outlet substrate rest PASS2. The holding arm 10b having delivered the treated wafer W is retracted to the original position. Then, the holding arms 10a and 10b are slightly raised together, and thereafter the now unloaded holding arm 10b is advanced again to pick up the wafer W to be treated from the feed inlet substrate rest PASS1. The holding arm 10b having received the wafer W is retracted to the original position.

In this embodiment, as described above, only the holding arm 10b is used in transferring the treated wafer W and wafer W to be treated to and from the substrate rests PASS1 and PASS2. After one holding arm 10a passes a wafer W to the substrate rest PASS2, both the holding arms 10a and 10b are empty. Thus, whichever holding arm 10a or 10b may be used to receive a wafer W from the substrate rest PASS1. However, in this embodiment, as will be apparent from the description made hereinafter, in order to use the upper holding arm 10a to receive a wafer W heated by a heating plate HP, the holding arm 10b is driven again to receive the wafer W from the substrate rest PASS1, rather than using the holding arm 10a which has been empty all along.

The above transfer of the wafer W to be treated and the treated wafer W to and from the substrate rests PASS1 and PASS2 is indicated by a transport step (1+α) of the first main transport mechanism 10A in FIG. 11. Here, "α" represents the part of the transport step for slightly raising the holding arms 10a and 10b from the position opposed to the substrate rest PASS2 to the position opposed to the substrate rest PASS1 in order to receive the wafer W to be treated from the substrate rest PASS1. As noted hereinbefore, the substrate rests PASS1 and PASS2 are arranged vertically and close to each other. The time consumed in the movement between substrate rests PASS1 and PASS2 is brief and negligible. Thus, the transport step (1+α) may be regarded as one transport step (i.e. a substrate transfer operation carried out by the main transport mechanism within a predetermined time (e.g. four seconds) in this embodiment).

Upon completion of the transfer of wafers W to and from the substrate rests PASS1 and PASS2, the first main transport mechanism 10A vertically moves and swings together the unloaded holding arm 10a holding no wafer W and the holding arm 10b holding the wafer W to be treated to a position opposed to a predetermined cooling plate CP of the antireflection film heat-treating modules 9. Usually, a prior-treated wafer W is present on this cooling plate CP. Thus, the unloaded holding arm 10a is first advanced to pick up the cooled wafer W from the cooling plate CP. Then, the holding arm 10b holding the wafer W to be treated is advanced to place the wafer W to be treated on the cooling plate CP. The wafer W placed on the cooling plate CP is cooled to room temperature with high precision while the main transport mechanism 10A performs other transport operations. The transfer of wafers W to and from the cooling plate CP is carried out without vertically moving the two holding arms 10a and 10b. Thus, the transfer of wafers W to and from the cooling plate CP is carried out in one transport step of the first main transport mechanism 10A (see transport step (2) of the first main transport mechanism 10A shown in FIG. 11).

Upon completion of the transfer of wafers W to and from the cooling plate CP, the first main transport mechanism 10A vertically moves and swings together the holding arm 10a holding the cooled wafer W and the unloaded holding arm 10b to a position opposed to a predetermined one of the antireflection film coating modules 8. Usually, a prior-treated wafer W is present in this antireflection film coating module 8. Thus, the unloaded holding arm 10b is first advanced to pick up the treated wafer W from the spin chuck 11 in the antireflection film coating module 8. Then, the holding arm 10a holding the wafer W is advanced to place the wafer W on the spin chuck 11. The wafer W placed on the spin chuck 11 is coated with antireflection film while the main transport mechanism 10A performs other transport operations. The transfer of wafers W to and from the spin chuck 11 corresponds to transport step (3) of the first main transport mechanism 10A shown in FIG. 11. The "BARC" in FIG. 11 indicates the antireflection film coating module 8.

Upon completion of the transfer of wafers W to and from the spin chuck 11, the first main transport mechanism 10A vertically moves and swings together the holding arm 10a holding no wafer W and the holding arm 10b holding the wafer W coated with antireflection film to a position opposed to a predetermined heating plate HP. Usually, a prior-treated wafer W is present also on this heating plate HP. Thus, the unloaded holding arm 10a is first advanced to pick up the heated wafer W from the heating plate HP. Then, the holding arm 10b is advanced to place the wafer W to be treated on the heating plate HP. The wafer W placed on the heating plate HP is heat-treated to have superfluous solvent removed from the antireflection film on the wafer W while the main transport mechanism 10A performs other transport operations. The transfer of wafers W to and from the heating plate HP corresponds to transport step (4) of the first main transport mechanism 10A shown in FIG. 11.

Upon completion of the transfer of wafers W to and from the heating plate HP, the first main transport mechanism 10A vertically moves and swings together the holding arm 10a holding the heated wafer W and the unloaded holding arm 10b to a position opposed to one of the water-cooled cooling plates WCP installed on the partition 13. As in the cases noted above, the unloaded holding arm 10b is first advanced to pick up a treated wafer W from the cooling plate WCP. Then, the holding arm 10a is advanced to place the wafer W on the cooling plate WCP. The wafer W placed on the cooling plate WCP is roughly cooled while the main transport mechanism 10A performs other transport operations. The transfer of wafers W to and from the cooling plate WCP corresponds to transport step (5) of the first main transport mechanism 10A shown in FIG. 11.

Upon completion of the transfer of wafers W to and from the cooling plate WCP, the first main transport mechanism 10A raises together the unloaded holding arm 10a and the holding arm 10b holding the roughly cooled wafer W to a position opposed to the substrate rests PASS3 and PASS4 arranged above the cooling plates WCP. The holding arm 10b is advanced to place the wafer W on the upper, substrate rest PASS3 ("feed outlet substrate rest" as seen from the antireflection film forming cell C2). Usually, the lower, substrate returning rest PASS4 ("return inlet substrate rest" as seen from the antireflection film forming cell C2) is holding a developed wafer W sent thereto from the developing cell C4 through the resist film forming cell C3. After slightly lowering the holding arms 10a and 10b, the holding arm 10b now empty is advanced again to pick up the developed wafer W from the substrate rest PASS4.

The transfer of wafers W to and from the substrate rests PASS3 and PASS4 corresponds to the transport step (6+α) of the first main transport mechanism 10A shown in FIG. 11. As noted hereinbefore, "α" represents the brief part of the transport step for slightly raising and lowering the holding arms 10a and 10b. Thus, the transport step (6+α) may be regarded as one transport step.

The first main transport mechanism 10A of the antireflection film forming cell C2 repeats the transport step (1+α) through transport step (6+α) described above. A total of the transport step (1+α) through transport step (6+α) makes approximately six transport steps of the first main transport mechanism 10A. Assuming that one transport step takes four seconds, the first main transport mechanism 10A completes one cycle of substrate transport in about 24 seconds. In other words, the antireflection film forming cell C2 feeds one wafer W every 24 seconds (i.e. 150 wafers per hour) to the next, resist film forming cell C3.

As is clear from the above description, wafers W heated on the heating plate HP are always carried by the upper holding arm 10a. Since a heated wafer W directs its thermal influence strongly upward, the lower holding arm 10b is checked against temperature rise under the influence of the heated wafer W. The lower holding arm 10b undergoing little thermal influence is used to feed wafers W from the antireflection film forming cell C2 to the next, resist film forming cell C3. This restrains temperature variations of the wafers W put to the resist film forming treatment.

The antireflection film forming cell C2 in this embodiment transfers wafers W an even number of times (i.e. the transfer of wafers W accompanying the treatments represented by "CP", "BARC", "HP" and "WCP" in FIG. 11) between the transfer of wafers W to and from the substrate rests PASS1 and PASS2 and the transfer of wafers W to and from the substrate rests PASS3 and PASS4. In such a case, it is not absolutely necessary to use only one holding arm 10b for transferring wafers W to and from the substrate rests PASS1–PASS4. Even where wafers W are transferred to and from the substrate rests PASS1 and PASS2 and the substrate rests PASS3 and PASS4 by using the two holding arms 10*a* and 10*b*, the wafers W immediately after the heating may be held exclusively by one holding arm 10*a*.

However, where the number of times wafers W are transferred (i.e. the number of treatments accompanying the transfer of wafers) is an odd number of times (as in the post-exposure heating cell C5 described hereinafter) between the transfer of wafers W to and from the substrate rests PASS1 and PASS2 and the transfer of wafers W to and from the substrate rests PASS3 and PASS4, the use of the two holding arms 10*a* and 10*b* (although the result is similar to the use of only one holding arm) in transferring wafers W to and from the substrate rests PASS1 and PASS2 and the substrate rests PASS3 and PASS4 as noted above constitutes an alternate use of the holding arms in handling the wafers W for every cycle of transport. It is impossible to handle the heated wafers W only with one holding arm 10*a*. Consequently, the two holding arms 10*a* and 10*b* store heat under the thermal influence of the heated wafers W to exert an adverse thermal influence on other wafers W.

In this embodiment, on the other hand, when transferring wafers W to and from two substrate rests, with one of the two holding arms 10*a* and 10*b* holding a wafer W, the wafer W on the one holding arm is first passed to one of the substrate rests so that both the holding arms 10*a* and 10*b* temporarily become empty. Thus, either of the holding arms 10*a* and 10*b* can receive a wafer W from the other substrate rest. Where the transfer of wafers W (i.e. treatment accompanying wafer transfer) takes place an odd number of times between the transfer of wafers W to and from the substrate rests PASS1 and PASS2 and the transfer of wafers W to and from the substrate rests PASS3 and PASS4, one holding arm (e.g. holding arm 10*b*) may be used to transfer wafers W to and from two substrate rests at one side (e.g. the feed inlet substrate rest and return outlet substrate rest arranged vertically and close to each other), and the two holding arms 10*a* and 10*b* to transfer wafers W to and from two substrate rests at the other side (e.g. the feed outlet substrate rest and return inlet substrate rest arranged vertically and close to each other). In this way, the same holding arm may always be used to transfer a wafer W for each treatment. That is, one of the two empty holding arms 10*a* and 10*b* is driven to receive a wafer W from an inlet substrate rest in order to satisfy the condition that, for every transport cycle, the same holding arm 10*a* or 10*b* receives a wafer W heated by the heating plate HP. This suppresses the thermal influence of the holding arms 10*a* and 10*b* on the wafers W. Even if certain thermal influence were exerted from the holding arms 10*a* and 10*b* to the wafers W, such thermal influence would not vary from wafer W to wafer W. "Variations" in the thermal influence on the wafers W are minimized to stabilize the quality of substrate treatment.

The above-described method of transferring wafers W to and from the two substrate rests by using only one holding arm 10*b* is applicable also to the other treating cells C2–C4 (but not to the post-exposure heating cell C5) described hereinafter. However, this invention is not limited to the above method of transferring wafers W. Where no consideration is needed regarding the thermal influence of the holding arms on the wafer W, the two holding arms may be used to transfer wafers W to and from all the substrate rests.

Operation of the resist film forming cell C3 (resist film forming block 3) will be described. After the wafer W coated with antireflection film is placed on the substrate rest PASS3 ("feed inlet substrate rest" as seen from the resist film forming cell C3), as shown in FIG. 11, the second main transport mechanism 10B of cell C3 places a developed wafer W held by one holding arm 10*b* on the substrate rest PASS4 ("return outlet substrate rest" as seen from the resist film forming cell C3). Then, the second main transport mechanism 10B loads the wafer W from substrate rest PASS3 on the holding arm 10*b*. The transfer of wafers W to and from the substrate rests PASS3 and PASS4 is indicated by transport step (1+α) of the second main transport mechanism 10B in FIG. 11. As noted hereinbefore, "α" represents a negligible time, and the transport step (1+α) may be regarded as one transport step.

Upon completion of the transfer of wafers W to and from the substrate rests PASS3 and PASS4, the second main transport mechanism 10B moves the holding arm 10*a* holding no wafer W and the holding arm 10*b* holding the wafer W to a position opposed to a predetermined cooling plate CP of the resist film heat-treating modules 16. The unloaded holding arm 10*a* is first advanced to pick up a cooled wafer W from the cooling plate CP. Then, the holding arm 10*b* is advanced to place the wafer W to be treated on the cooling plate CP. The transfer of wafers W to and from the cooling plate CP corresponds to transport step (2) of the second main transport mechanism 10B shown in FIG. 11.

Upon completion of the transfer of wafers W to and from the cooling plate CP, the second main transport mechanism 10B moves the holding arm 10*b* holding the cooled wafer W and the unloaded holding arm 10*a* to a position opposed to a predetermined one of the resist film coating modules 15. The unloaded holding arm 10*b* is first advanced to pick up a treated wafer W from the spin chuck 17 in the resist film coating module 15. Then, the holding arm 10*a* holding the wafer W is advanced to place the wafer W on the spin chuck 17. The wafer W placed on the spin chuck 17 is coated with resist film while the main transport mechanism 10B performs other transport operations. The transfer of wafers W to and from the spin chuck 17 corresponds to transport step (3) of the second main transport mechanism 10B shown in FIG. 11. The "PR" in FIG. 11 indicates the resist film coating module 15.

Upon completion of the transfer of wafers W to and from the spin chuck 17, the second main transport mechanism 10B moves the holding arm 10*a* holding no wafer W and the holding arm 10*b* holding the wafer W coated with resist film to a position opposed to a predetermined heating module PHP with temporary substrate deposit 19. The unloaded holding arm 10*a* is first advanced to pick up a treated wafer W from the temporary substrate deposit 19 of the heating module PHP. Then, the holding arm 10*b* is advanced to place the wafer W to be treated on the temporary substrate deposit 19. While the main transport mechanism 10B performs other transport operations, the local transport mechanism 20 transfers the wafer W placed on the temporary substrate deposit 19 to the heating plate HP in the heating module PHP for heat treatment. The wafer W heat-treated on the heating plate HP is returned to the temporary substrate deposit 19 by the same local transport mechanism 20. The wafer W is returned to the temporary substrate deposit 19 as held by the holding plate 24 of the local transport mechanism 20, and is cooled inside the temporary substrate deposit 19 by the cooling mechanism in the holding plate 24. The transfer of wafers W to and from the heating module PHP corresponds to transport step (4) of the second main transport mechanism 10B shown in FIG. 11.

Upon completion of the transfer of wafers W to and from the heating module PHP, the second main transport mechanism 10B moves the holding arm 10*a* holding the heated wafer W and the unloaded holding arm 10*b* to a position opposed to a cooling plate CP of the resist film heat-treating modules 16. The unloaded holding arm 10b is advanced to pick up a cooled wafer W from the cooling plate CP. Then, the holding arm 10a is advanced to place the wafer W to be treated on the cooling plate CP. The transfer of wafers W to and from the cooling plate CP corresponds to transport step (5) of the second main transport mechanism 10B shown in FIG. 11.

Upon completion of the transfer of wafers W to and from the cooling plate CP, the second main transport mechanism 10B moves the unloaded holding arm 10a and the holding arm 10b holding the cooled wafer W to a position opposed to the substrate rests PASS5 and PASS6. The holding arm 10b is advanced to place the wafer W on the upper, substrate feeding rest PASS5 ("feed outlet substrate rest" as seen from the resist film forming cell C3). Then, the holding arm 10b is driven to pick up a developed wafer W from the lower, substrate returning rest PASS6 ("return inlet substrate rest" as seen from the resist film forming cell C3).

The transfer of wafers W to and from the substrate rests PASS5 and PASS6 corresponds to the transport step (6+α) of the second main transport mechanism 10B shown in FIG. 11. The transport step (6+α) is regarded as one transport step.

The second main transport mechanism 10B of the resist film forming cell C3 repeats the transport step (1+α) through transport step (6+α) described above. A total of the transport step (6+α) through transport step (1+α) makes approximately six transport steps of the second main transport mechanism 10B as in the case of the first main transport mechanism 10A. Thus, the second main transport mechanism 10B completes the same one cycle of substrate transport (in about 24 seconds in this embodiment) as does the first main transport mechanism 10A. In other words, the resist film forming cell C3 feeds one wafer W every 24 seconds (i.e. 150 wafers per hour) to the next, developing cell C4.

Operation of the developing cell C4 will be described. After the wafer W coated with resist film is placed on the substrate rest PASS5 ("feed inlet substrate rest" as seen from the developing cell C4), as shown in FIG. 11, the third main transport mechanism 10C of cell C4 places a developed wafer W held by one holding arm 10b on the substrate rest PASS6 ("return outlet substrate rest" as seen from the developing cell C4). Then, the third main transport mechanism 10C loads the wafer W from the substrate rest PASS5 on the holding arm 10b. The transfer of wafers W to and from the substrate rests PASS5 and PASS6 is indicated by transport step (1+α) of the third main transport mechanism 10C in FIG. 11.

Upon completion of the transfer of wafers W to and from the substrate rests PASS5 and PASS6, the third main transport mechanism 10C moves the holding arm 10a holding no wafer W and the holding arm 10b holding the wafer W to a position opposed to the substrate rests PASS7 and PASS8 included in the vertical arrangement of heat-treating modules 31. The holding arm 10b is advanced to place the wafer W coated with resist film on the upper, substrate feeding rest PASS7 ("feed outlet substrate rest" as seen from the developing cell C4). Then, the holding arm 10b is driven to pick up a wafer W having undergone post-exposure heating treatment from the lower, substrate returning rest PASS8 ("return inlet substrate rest" as seen from the developing cell C4). The transfer of wafers W to and from the substrate rests PASS7 and PASS8 is indicated by transport step (2+α) of the third main transport mechanism 10C shown in FIG. 11.

Upon completion of the transfer of wafers W to and from the substrate rests PASS7 and PASS8, the third main transport mechanism 10C moves the unloaded holding arm 10a and the holding arm 10b holding the exposed and heat-treated wafer W to a position opposed to a predetermined cooling plate CP of the heat-treating modules 31. The unloaded holding arm 10a is first advanced to pick up a cooled wafer W from the cooling plate CP. Then, the holding arm 10b is advanced to place the wafer W to be treated on the cooling plate CP. The transfer of wafers W to and from the cooling plate CP corresponds to transport step (3) of the third main transport mechanism 10C shown in FIG. 11.

Upon completion of the transfer of wafers W to and from the cooling plate CP, the third main transport mechanism 10C moves the holding arm 10a holding the cooled wafer W and the unloaded holding arm 10b to a position opposed to a predetermined one of the developing modules 30. The unloaded holding arm 10b is first advanced to pick up a treated wafer W from the spin chuck 32 in the developing module 30. Then, the holding arm 10a holding the wafer W is advanced to place the wafer W on the spin chuck 32. The wafer W placed on the spin chuck 32 is developed while the main transport mechanism 10C performs other transport operations. The transfer of wafers W to and from the spin chuck 32 corresponds to transport step (4) of the third main transport mechanism 10C shown in FIG. 11. The "SD" in FIG. 11 indicates the developing module 30.

Upon completion of the transfer of wafers W to and from the spin chuck 32, the third main transport mechanism 10C moves the unloaded holding arm 10a and the holding arm 10b holding the developed wafer W to a position opposed to a predetermined heating plate HP of the developing modules 31. The unloaded holding arm 10a is first advanced to pick up a treated wafer W from the heating plate HP. Then, the holding arm 10b is advanced to place the wafer W to be treated on the heating plate HP. The transfer of wafers W to and from the heating plate HP corresponds to transport step (5) of the third main transport mechanism 10C shown in FIG. 11.

Upon completion of the transfer of wafers W to and from the heating plate HP, the third main transport mechanism 10C moves the holding arm 10a holding the heated wafer W and the unloaded holding arm 10b to a position opposed to the water-cooled cooling plates WCP installed on the partition 13 adjacent the resist film forming cell C3. The unloaded holding arm 10b is advanced to pick up a treated wafer W from the cooling plate WCP, and the holding arm 10a is advanced to place the wafer W to be treated on the cooling plate WCP. The transfer of wafers W to and from the cooling plate WCP corresponds to transport step (6) of the third main transport mechanism 10C shown in FIG. 11.

The third main transport mechanism 10C of the developing cell C4 repeats the transport step (1+α) through transport step (6) described above. A total of the transport step (1+α) through transport step (6) makes approximately six transport steps of the third main transport mechanism 10C as in the case of the first and second main transport mechanisms 10A and 10B. Thus, the third main transport mechanism 10C completes the same one cycle of substrate transport (in about 24 seconds in this embodiment) as do the first and second main transport mechanisms 10A and 10B. In other words, the developing cell C4 feeds one wafer W every 24 seconds (i.e. 150 wafers per hour) to the next, post-exposure heating cell C5.

Operation of the post-exposure heating cell C5 will be described. After the wafer W coated with resist film is placed on the substrate rest PASS7 ("feed inlet substrate rest" as seen from the post-exposure heating cell C5), as shown in FIG. 11, the fourth main transport mechanism 10D of cell C5 places a developed and heated wafer W held by the holding arm 10b on the substrate rest PASS8 ("return outlet substrate rest" as seen from the post-exposure heating cell C5). Then, the fourth main transport mechanism 10D loads the wafer W from the substrate rest PASS7 on the holding arm 10b. The transfer of wafers W to and from the substrate rests PASS7 and PASS8 is indicated by transport step (1+α) of the fourth main transport mechanism 10D in FIG. 11.

Upon completion of the transfer of wafers W to and from the substrate rests PASS7 and PASS8, the fourth main transport mechanism 10D moves the holding arm 10a holding no wafer W and the holding arm 10b holding the wafer W to a position opposed to a predetermined one of the edge exposing modules EEW. The unloaded holding arm 10a is first advanced to pick up an edge-exposed wafer W from the spin chuck 36 in the edge exposing module EEW. Then, the holding arm 10b holding the wafer W is advanced to place the wafer W to be treated on the spin chuck 36. The wafer W placed on the spin chuck 36 has peripheries thereof exposed while the main transport mechanism 10D performs other transport operations. The transfer of wafers W to and from the spin chuck 36 corresponds to transport step (2) of the fourth main transport mechanism 10D shown in FIG. 11.

Upon completion of the transfer of wafers W to and from the spin chuck 36, the fourth main transport mechanism 10D moves the holding arm 10a holding the edge-exposed wafer W and the unloaded holding arm 10b to a position opposed to a predetermined cooling plate CP of the heat-treating modules 31. The unloaded holding arm 10b is advanced to pick up a cooled wafer W from the cooling plate CP, and the holding arm 10a is advanced to place the edge-exposed wafer W on the cooling plate CP. The transfer of wafers W to and from the cooling plate CP corresponds to transport step (3) of the fourth main transport mechanism 10D shown in FIG. 11.

Upon completion of the transfer of wafers W to and from the cooling plate CP, the fourth main transport mechanism 10D moves the unloaded holding arm 10a and the holding arm 10b holding the cooled wafer W to a position opposed to the substrate rests PASS9 and PASS10. Then, the holding arm 10b is advanced to place the wafer W on the upper, substrate feeding rest PASS9 ("feed outlet substrate rest" as seen from the post-exposure heating cell C5), and the holding arm 10a is advanced to pick up a wafer W exposed in the exposing apparatus STP from the lower, substrate returning rest PASS10 ("return inlet substrate rest" as seen from the post-exposure heating cell C5). The transfer of wafers W to and from the substrate rests PASS9 and PASS10 corresponds to transport step (4+α) of the fourth main transport mechanism 10D shown in FIG. 11.

In this embodiment, the two holding arms 10a and 10b are used to transfer wafers W to and from the substrate rests PASS9 and PASS10 only. This measure is taken to avoid the situation described in relation to the antireflection film forming cell C2. That is, the transfer of wafers W to and from a heating unit PHP, described hereinafter, takes place once (i.e. an odd number of times) between the transfer of wafers W to and from the substrate rests PASS9 and PASS10 and the transfer of wafers W to and from the substrate rests PASS7 and PASS8. If only one holding arm 10b were used to transfer of wafers W to and from the substrate rests PASS9 and PASS10, the two holding arms 10a and 10b would alternate for every transport cycle of transferring wafers W to and from the substrate rests PASS7 and PASS8.

Upon completion of the transfer of wafers W to and from the substrate rests PASS9 and PASS10, the fourth main transport mechanism 10D moves the holding arm 10a holding the exposed wafer W and the unloaded holding arm 10b to a position opposed to a predetermined heating module PHP, with a temporary substrate deposit, of the heat-treating modules 31. The unloaded holding arm 10b is first advanced to pick up an exposed and heated wafer W from the heating module PHP (more particularly from the temporary substrate deposit 19). Then, the holding arm 10a is advanced to place the exposed wafer W in the heating module PHP (more particularly in the temporary substrate deposit 19). While the main transport mechanism 10D performs other transport operations, the local transport mechanism 20 transfers the wafer W placed on the temporary substrate deposit 19 to the heating plate HP for heat treatment. Subsequently, the heated wafer W is returned to the temporary substrate deposit 19 and cooled in the temporary substrate deposit 19 by the same local transport mechanism 20. The transfer of wafers W to and from the heating module PHP corresponds to transport step (5) of the fourth main transport mechanism 10D shown in FIG. 11.

The fourth main transport mechanism 10D of the post-exposure heating cell C5 repeats the transport step (1+α) through transport step (5) described above. A total of the transport step (1+α) through transport step (5) makes approximately five transport steps of the fourth main transport mechanism 10D, which are one less than the transport steps shared by the first to third main transport mechanisms 10A–10C. In the post-exposure heating cell C5 only, the fourth main transport mechanism 10D is operable in cycles of 20 seconds when one transport step takes four seconds. However, since the other, first to third main transport mechanisms 10A–10C operate in cycles of 24 seconds, the post-exposure heating cell C5, after all, feeds one wafer W every 24 seconds (i.e. 150 wafers per hour) to the next, interface cell C6, i.e. at the same rate as the other cells.

Operation of the interface cell C6 will be described. After the edge-exposed wafer W is placed on the substrate rest PASS9 ("feed inlet substrate rest" as seen from the interface cell C6), the transport mechanism 35 of the interface cell C6 receives the wafer W from the substrate rest PASS9, and passes the wafer W on to the adjoining exposing apparatus STP. Furthermore, the interface's transport mechanism 35 receives an exposed wafer W from the exposing apparatus STP, and places this wafer W on the substrate returning rest PASS10 ("return outlet substrate rest" as seen from the interface cell C6). The interface's transport mechanism 35 repeats this substrate transport operation.

In the substrate treating apparatus in this embodiment, as described above, the respective cells C1–C6 transport wafers W, under control of the cell controllers CT1–CT6, by using the main transport mechanisms 10 (however, the indexer cell C1 uses the indexer's transport mechanism 7, and the interface cell C6 the interface's transport mechanism 35). The two adjoining cells exchange information on substrate transport, only indicating that a wafer has been placed on a substrate rest PASS, and that a wafer W has been received. That is, each cell performs substrate transport within itself and independently without monitoring states of substrate transport in the adjoining cells. Thus, the cells do not necessarily deliver wafers W at the same time, but with certain time lags. However, such time lags are absorbed by varied lengths of time for which the wafers W are kept on the substrate rests provided for transferring the wafers W between the adjoining cells. The time lags in the substrate transfer between the adjoining cells never impede the substrate transport.

According to this embodiment, therefore, the cell controllers CT1–CT6 have a reduced load of controlling the cells C1–C6, whereby the substrate treating apparatus provides a correspondingly improved throughput, and has a correspondingly simplified construction. A substrate inspecting cell including substrate inspecting modules and a main transport mechanism may easily be installed between appropriate cells, which renders the substrate treating apparatus highly flexible. Further, where the apparatus includes a cell of less transport steps than the other cells (the post-exposure heating cell C5 in this embodiment), new treating modules (e.g. substrate inspecting modules) may easily be added to this cell without affecting the other cells.

The exposing apparatus STP or developing cell C4 may become incapable of accepting wafers W due to some fault. Operation on such an occasion will be described nest.

Assume that the exposing apparatus STP has become incapable of accepting wafers W. In this case, the transport mechanism 35 of the interface cell C6 picks up wafers W from the substrate rest PASS9, and temporarily stores these wafers W in the feed buffer SBF. Treatment is continued only for the number of wafers W stored in the buffer SBF. When the buffer SBF is expected to accommodate no more wafers W, the operation for fetching wafers W from the indexer cell C1 is stopped. When the exposing apparatus STP has become ready to accept wafers W, the interface's transport mechanism 35 fetches the wafers W from the buffer SBF in the order in which the wafers W were stored, and passes the wafers W to the exposing apparatus STP. Thereafter the apparatus resumes normal operations.

Assume that the developing cell C4 has become incapable of accepting wafers W. In this case, the interface's transport mechanism 35 picks up wafers W from the substrate rest PASS9 and temporarily stores these wafers W in the feed buffer SBF to stop the transport of wafers W to the exposing apparatus STP. When the buffer SBF is expected to accommodate no more wafers W, the operation for fetching wafers W from the indexer cell C1 is stopped as in the foregoing case. As for the wafers W already fed to the exposing apparatus STP, the interface's transport mechanism 35 passes exposed wafers W successively returned from the exposing apparatus STP to the substrate rest PASS10 as usual. The fourth main transport mechanism 10D of the post-exposure heating cell C5 passes the exposed wafers W to the heating modules PHP as usual. The fourth main transport mechanism 10D temporarily stores the wafers W having undergone the post-exposure heat treatment in the heating modules PHP, in the substrate return buffer RBF in the cell C5, instead of placing these wafers W on the substrate rest PASS8. Similar post-exposure heating is carried out for the number of wafers W already loaded into the exposing apparatus STP, and these wafers W are thereafter stored in the substrate return buffer RBF. When the developing cell C4 has become ready to accept wafers W, the fourth main transport mechanism 10D fetches the wafers W from the buffer RBF in the order in which the wafers W were stored, and passes the wafers W to the substrate rest PASS8. Thereafter the apparatus resumes normal operations.

In the apparatus described above, the substrate return buffer RBF is provided in the post-exposure heating cell C5 for storing wafers W returned from the exposing apparatus STP and heated in the heating modules PHP. Thus, the wafers W returned from the exposing apparatus STP are never left untreated for a long time, without receiving post-exposure heating treatment. The conventional substrate treating apparatus has a feed buffer and a return buffer installed in the same location, and the interface's transport mechanism stores wafers W returned from the exposing apparatus directly in the return buffer. Thus, the wafers W returned from the exposing apparatus are left untreated for a long time.

A chemically amplified photoresist needs to be heated promptly after exposure. With the above storage method used in the conventional apparatus, even if substrates are stored in the return buffer, the quality of resist film lowers after all. This poses a problem of having to separate the resist film for reclaiming treatment. By contrast, the apparatus in this embodiment promptly heats the wafers W returned from the exposing apparatus STP, and thereafter stores the wafers W in the buffer RBF. This maintains the quality of photoresist film, and dispenses with the reclaiming treatment required by the conventional apparatus.

Though omitted from the above description of operation, description will now be made of a substrate transport control carried out in the event of failure of a certain treating module (e.g. edge exposing module EEW) in the post-exposure heating cell C5, and a substrate transport control carried out when wafers W are placed on both the feed inlet substrate rest PASS7 and return inlet substrate rest PASS10.

Figure 12:
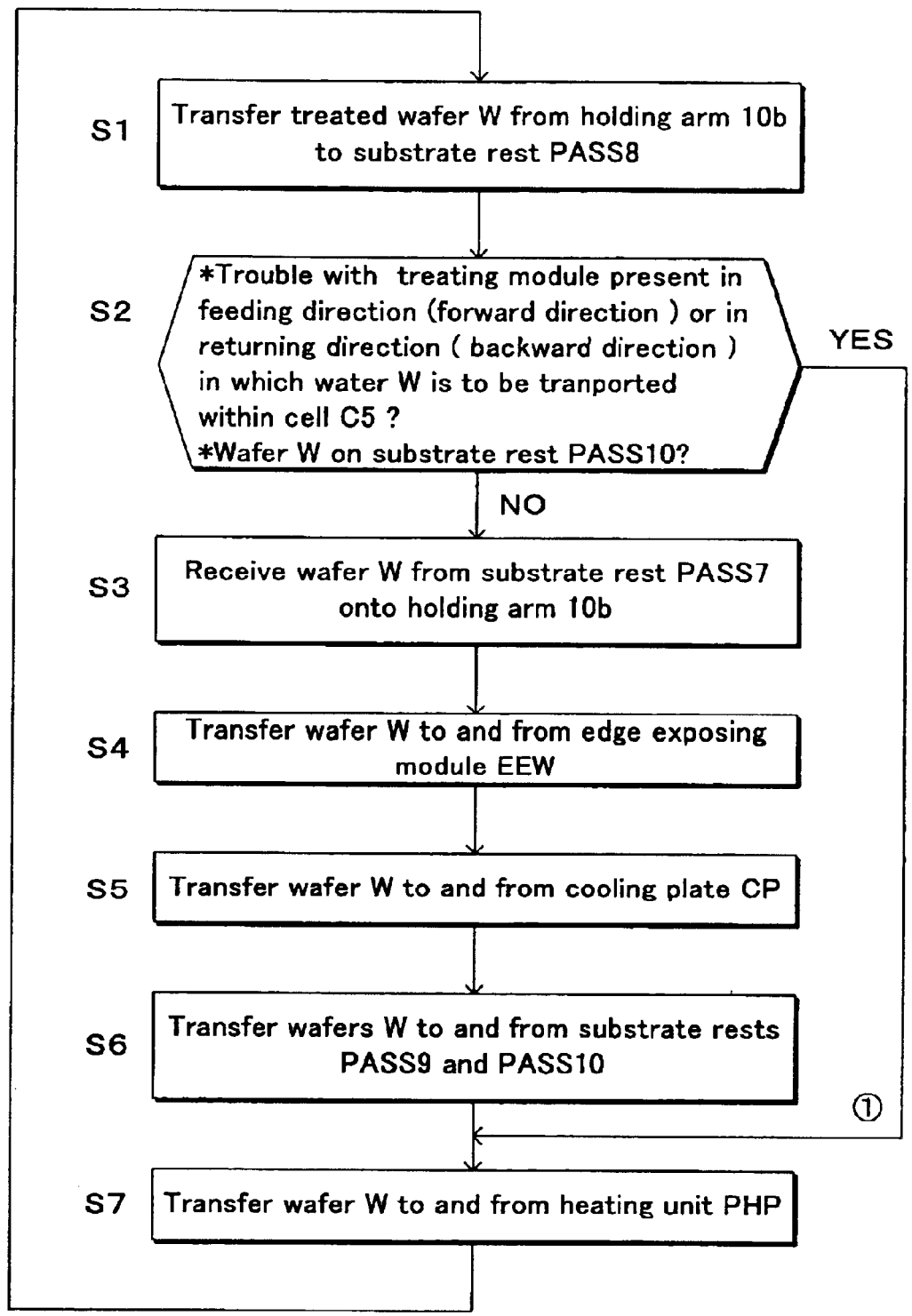
FIG. 12 is a flow chart illustrating operation of the apparatus according to the invention.

Reference is made to the flow chart shown in FIG. 12. First, the fourth main transport mechanism 10D of the cell C5, with one holding arm 10a unloaded and the other holding arm 10b carrying an exposed and heated wafer W, moves to the substrate rests PASS7 and PASS8, and transfers the treated wafer W from the holding arm 10b to the substrate rest (return outlet substrate rest) PASS8 (step S1).

The following two determinations are made before receiving a wafer W onto the holding arm 10b now empty (step S2). Firstly, it is determined whether any trouble has occurred with a treating module present in the feeding direction (forward direction) or in the returning direction (backward direction) in which the wafer W is to be transported within the cell C5. Secondly, it is determined whether the return inlet substrate rest PASS10 has a wafer W placed thereon. These determinations are made by the cell controller CT5 associated with the cell C5.

When the treating modules in the cell C5 are free from trouble and no wafer W is found on the return inlet substrate rest PASS10, the wafer W is received from the substrate rest PASS7 onto the holding arm 10b (step S3). Then, as in the operation described above, a transfer of wafer W to and from an edge exposing module EEW (step S4), a transfer of wafer W to and from a cooling plate CP (step S5), a transfer of wafers W to and from the substrate rests PASS9 and PASS10 (step S6), and a transfer of wafer W to and from a heating unit PHP (step S7), are performed in the stated order.

On the other hand, when trouble has occurred with a treating module in the cell C5 or a wafer W is present on the return inlet substrate rest PASS10, the following substrate transport is carried out with priority given to post-exposure baking (PEB), without receiving the wafer W onto the holding arm 10b, i.e. with the two holding arms 10a and 10b remaining unloaded.

When, for example, trouble has occurred with an edge exposing module EEW which is a wafer treating module present in the feeding direction (forward direction), the main transport mechanism 10D, with the two holding arms 10a and 10b unloaded, receives the exposed wafer W from the substrate rest PASS10 onto the holding arm 10a in order to perform only the transport in the returning direction (backward direction), and not in the feeding direction (forward direction) (step S6: branch ① in FIG. 12). The wafer W received is transported to a post-exposure heating module PHP for transfer of wafer W to and from this heating unit PHP (step S7). The main transport mechanism 10D having received the exposed and heated wafer W from the heating module PHP passes the wafer W to the substrate rest PASS8 (step S1). The above substrate transport control is repeated while the edge exposing module EEW remains inoperative.

In this embodiment, as described above, the wafer W held by one holding arm 10b is first passed to the substrate rest PASS8, as in step S1, to render the two holding arms 10a and 10b temporarily empty. When trouble occurs with a treating module in the cell C5, the two empty holding arms 10a and 10b may be used to put exposed wafers W to heating treatment promptly.

Such substrate transport control performed when trouble has occurred with a treating module is not limited to the post-exposure heating cell C5, but is effective for the other cells also. Assume, for example, that trouble has occurred with a resist film coating module 15 in the resist film forming cell C3. In this case, the second main transport mechanism 10B of the cell C3 passes a treated wafer W held by one holding arm 10b to the substrate rest PASS4. Before receiving a wafer W from the substrate rest PASS3 onto the holding arm 10b, it is checked whether trouble has occurred with any treating module in the cell C3. When, for example, trouble has occurred with a resist film coating module 15 present in the feeding direction (forward direction), the second main transport mechanism 10B does not receive the wafer W from the substrate rest PASS3, but transfers wafers W to and from the substrate rests PASS6 and PASS4 in order to perform only the transport in the returning direction (backward direction), and not in the feeding direction (forward direction). Consequently, wafers W returned from the developing cell C4 may be returned smoothly to the antireflection film forming cell C2.

Assume further, for example, that trouble has occurred with a developing module 30 present in the returning direction (backward direction) in the developing cell C4. In this case, the third main transport mechanism 10C of the cell C4 passes a treated wafer W held by one holding arm 10b to the substrate rest PASS4. Before receiving a wafer W from the substrate rest PASS6 onto the holding arm 10b, it is checked whether trouble has occurred with any treating module in the cell C4. When, for example, trouble has occurred with a resist film coating module 30 present in the returning direction (backward direction), the third main transport mechanism 10C does not receive the wafer W from the substrate rest PASS6, but transfers wafers W to and from the substrate rests PASS3 and PASS5 in order to perform only the transport in the feeding direction (forward direction), and not in the returning direction (backward direction). Consequently, wafers W fed from the resist film forming cell C3 may be fed smoothly to the post-exposure heating cell C5.

Also when an exposed wafer W is found on the substrate rest PASS10 in step S2 of the flow chart shown in FIG. 12, the fourth main transport mechanism 10D does not receive a wafer W from the substrate rest PASS7 onto the holding arm 10b, but moves to receive the wafer W from the substrate rest PASS10 (step S6: branch (1) in FIG. 12). The exposed wafer W received is transported to a post-exposure heating module PHP for transfer of wafer W to and from this heating unit PHP (step S7). The wafer W exposed and heated is passed to the substrate rest PASS8 (step S1). Thus, when wafers W are placed on both the feed inlet substrate rest PASS7 and return inlet substrate rest PASS10, priority is given to the wafer W placed on the return inlet substrate rest PASS10 for transport, thereby to heat the exposed wafer W promptly.

Figure 13:
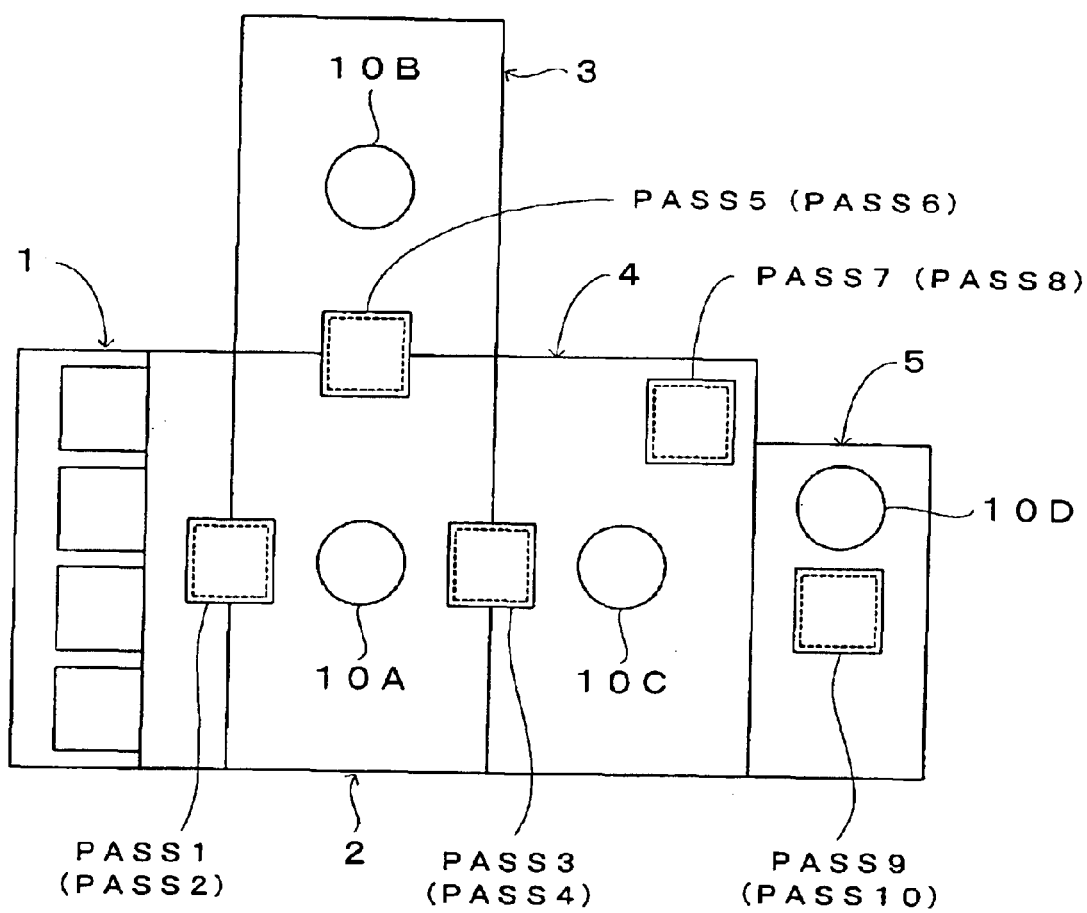
FIG. 13 is a view showing a layout of a modified substrate treating apparatus according to this invention.

This invention is not limited to the embodiment described above, but may be modified as follows:

(1) In the foregoing embodiment, each of the treating blocks 2–4 or treating cells C2–C5 has four substrate rests (i.e. the feed inlet substrate rest, return inlet substrate rest, feed outlet substrate rest and return outlet substrate rest). At least one treating block (or treating cell) may have an additional pair of inlet substrate rest and outlet substrate rest. In the substrate treating apparatus shown in FIG. 13, for example, the antireflection film forming block 2 has an inlet substrate rest PASS6 and an outlet substrate rest PASS5 besides the feed inlet substrate rest PASS1, return inlet substrate rest PASS4, feed outlet substrate rest PASS3 and return outlet substrate rest PASS2. A developing block 4 is disposed adjacent the antireflection film forming block 2 to share the substrate rests PASS3 and PASS4. A resist film forming block 3 is disposed adjacent the antireflection film forming block 2 to share the substrate rests PASS5 and PASS6. In this example, a wafer W treated in the antireflection film forming block 2 is fed to the resist film forming block 3 through the outlet substrate rest PASS5. The wafer W treated in this block 3 is returned to the antireflection film forming block 2 through the inlet substrate rest PASS6, and fed to the developing block 4 through the substrate rest PASS3. The wafer W developed is returned to the antireflection film forming block 2 through the substrate rest PASS4, and then directly returned to the indexer block 1 without passing through the resist film forming block 3. Thus, by providing six or more substrate rests for at least one treating block (treating cell), the treating blocks (or treating cells) may be arranged with increased freedom.

(2) In the foregoing embodiment, the feed inlet substrate rest and return outlet substrate rest are arranged vertically and close to each other, and so are the return inlet substrate rest and feed outlet substrate rest. Instead, each pair of substrate rests may be arranged horizontally and close to each other.

(3) In the foregoing embodiment, each of the substrate rests PASS1–PASS10 is constructed to receive only one wafer W at a time. At least one of the substrate rests may have a rack structure for storing a plurality of wafers W in multiple stages. Then, when a wafer W is already placed in the substrate rest, a succeeding wafer W may be placed in a different stage instead of removing the earlier-placed wafer W from the substrate rest. This provides an additional freedom for control of the main transport mechanism, and facilitates the substrate transport control. In the interface block 5, the substrate rest PASS9 may be modified into a multi-stage rack structure to serve also as a feed buffer SBF. Further, the substrate rest PASS10 may be modified into a multi-stage rack structure to serve also as a return buffer RBF.

(4) In the foregoing embodiment, each of the substrate rests PASS1–PASS10 is constantly in open state for allowing passage of wafers W. Where flowing of the atmosphere between adjacent treating blocks (treating cells) through these substrate rests is undesirable, shutter mechanisms may be provided for the openings of the substrate rests. Such shutter mechanisms are normally closed, and are opened only when the holding arms of the main transport mechanisms transfer wafers to or from the substrate rests.

(5) In the foregoing embodiment, each of the substrate rests PASS1–PASS10 simply receives a wafer W. Each substrate rest may include a cooling device (e.g. a water-cooled cooling plate) for cooling a wafer W in a general or broad way. Where cooling devices are provided for the substrate rest PASS3 of the antireflection film forming block 2 and for the substrate rest PASS6 of the developing block 4, wafers W may be cooled to and maintained at an appropriate temperature while the wafers W stand by on the substrate rests. These may serve also as cooling plates WCP.

(6) In the foregoing embodiment, the substrate rests PASS1–PASS10 are fixed. Instead, each substrate rest may be mounted on a horizontal moving mechanism for making a horizontal movement toward the main transport mechanism as necessary. With this construction, the substrate rest is horizontally movable to move a wafer W to a wafer transfer position, and thus the main transport mechanism may be moved horizontally over a reduced distance. This lightens restrictions on the construction or arrangement of the main transport mechanisms.

(7) In the foregoing embodiment, the first to fourth main transport mechanisms 10A–10D do not move horizontally, but only their holding arms are constructed vertically movable, swingable, and extendible and retractable. However, these main transport mechanisms 10A–10D may be adapted horizontally movable.

(8) The first to fourth main transport mechanisms 10A–10D each include two holding arms 10a and 10b. Instead, each may have a single holding arm or three or more holding arms.

(9) In the foregoing embodiment, the post-exposure heating cell C5 bridges the developing block 4 and interface block 5. The post-exposure heating cell C5 may be provided as an independent block (component assembled to its own block frame).

(10) In the foregoing embodiment, the antireflection film forming block 2 and resist film forming block 3 are provided individually. Instead, a single treating block may be provided for performing antireflection film forming treatment and resist film forming treatment. Where the application of antireflection film is unnecessary, the antireflection film formation block 2 may be omitted.

This invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating apparatus having a plurality of treating blocks arranged in juxtaposition, each of the treating blocks including treating modules for performing required treatments of substrates, and a single main transport mechanism for transferring the substrates to and from the treating modules, wherein:
   each of said treating blocks includes, as separate components, inlet substrate rests for receiving the substrates to be accepted to the treating block, and outlet substrate rests for receiving the substrates to be delivered from the treating block; and
   said main transport mechanism of each of said treating blocks is arranged to transfer the substrates through said inlet substrate rests and said outlet substrate rests.

2. A substrate treating apparatus as defined in claim 1, wherein:
   said inlet substrate rests include a feed inlet substrate rest for use in transporting the substrates forward through each of said treating blocks, and a return inlet substrate rest for use in transporting the substrates backward through each of said treating blocks; and
   said outlet substrate rests include a feed outlet substrate rest for use in transporting the substrates forward through each of said treating blocks, and a return outlet substrate rest for use in transporting the substrates backward through each of said treating blocks.

3. A substrate treating apparatus as defined in claim 2, wherein at least one of said treating blocks has an additional inlet substrate rest and an additional outlet substrate rest besides said feed inlet substrate rest, said return inlet substrate rest, said feed outlet substrate rest and said return outlet substrate rest.

4. A substrate treating apparatus as defined in claim 2, wherein said feed inlet substrate rest and said return outlet substrate rest are arranged close to each other, and said return inlet substrate rest and said feed outlet substrate rest are arranged close to each other.

5. A substrate treating apparatus as defined in claim 4, wherein said feed inlet substrate rest and said return outlet substrate rest are arranged vertically, and said return inlet substrate rest and said feed outlet substrate rest are arranged vertically.

6. A substrate treating apparatus as defined in claim 1, wherein at least one of said substrate rests has a construction for receiving a plurality of substrates in multiple stages.

7. A substrate treating apparatus as defined in claim 1, wherein at least one of said substrate rests has a shutter mechanism for closing an opening allowing passage of said substrates.

8. A substrate treating apparatus as defined in claim 1, wherein at least one of said substrate rests has cooling means for cooling the substrates placed thereon.

9. A substrate treating apparatus as defined in claim 1, wherein at least one of said substrate rests has horizontal moving means horizontally movable toward said main transport mechanism.

10. A substrate treating apparatus as defined in claim 1, wherein said main transport mechanism has at least two holding arms for holding the substrates.

11. A substrate treating apparatus as defined in claim 10, wherein said main transport mechanism is arranged, when transferring substrates to and from one of said inlet substrate rests and one of said outlet substrate rests, with one of said holding arms holding a substrate, and the other holding arm unloaded, to drive said one of said holding arms and transfer said substrate to said one of said outlet substrate rests, and thereafter to drive one of said holding arms, both now unloaded, and receive a different substrate from said one of said inlet substrate rests.

12. A substrate treating apparatus as defined in claim 2, wherein:
   said main transport mechanism has at least two holding arms for holding the substrates; and
   said main transport mechanism is arranged, when transferring substrates to and from one of said inlet substrate rests and one of said outlet substrate rests, with one of said holding arms holding a substrate, and the other holding arm unloaded, to drive said one of said holding arms and transfer said substrate to said one of said outlet substrate rests, thereafter to determine whether an abnormality has occurred with a destination forward or backward with respect to a direction of transport through one of said treating blocks or controlled units in which said main transport mechanism is disposed, and when an abnormality is confirmed, to transport the substrates only in a direction free from said abnormality.

13. A substrate treating apparatus as defined in claim 11, wherein:
   said treating modules include heat-treating modules having heating plates for heating the substrates and cooling plates for cooling the substrates; and said main transport mechanism is arranged to drive one of said at least two holding arms in unloaded state to receive a different substrate from one of said inlet substrate rests, to fulfill a condition that, in every transport cycle, the same one of said at least two holding arms receives substrates heated by said heating plates.

14. A substrate treating apparatus as defined in claim 2, wherein, when said feed inlet substrate rest and said return inlet substrate rest both have substrates placed thereon, said main transport mechanism receives the substrate from said return inlet substrate rest by priority.

15. A substrate treating apparatus as defined in claim 14, wherein:
   said main transport mechanism has at least two holding arms for holding the substrates; and
   said main transport mechanism is arranged, when transferring substrates to and from said feed inlet substrate rest and said return outlet substrate rest, with one of said holding arms holding a substrate, and the other holding arm unloaded, to drive said one of said holding arms and transfer said substrate to said return outlet substrate rest, thereafter to determine whether said return inlet substrate rest has a substrate placed thereon, when no substrate is found, to drive one of said holding arms in unloaded state and receive a different substrate from said feed inlet substrate rest, and when a substrate is found on said return inlet substrate rest, to move toward said return inlet substrate rest, without receiving the substrate from said feed inlet substrate rest, and with all said holding arms in unloaded state, and receive the substrate from said return inlet substrate rest for a predetermined transport process.

16. A substrate treating apparatus having a plurality of controlled units arranged in juxtaposition, each of the controlled units including treating modules for performing required treatments of substrates, and a single main transport mechanism for transferring the substrates to and from the treating modules, wherein:
   each of said controlled units includes, as separate components, inlet substrate rests for receiving the substrates to be accepted to the controlled unit, and outlet substrate rests for receiving the substrates to be delivered from the controlled unit;
   said main transport mechanism of each of said controlled units is arranged to transfer the substrates through said inlet substrate rests and said outlet substrate rests;
   each of said controlled units includes unit control means for controlling at least a substrate transfer operation of said main transport mechanism; and
   said unit control means is independently operable to control a series of substrate transports including transfer of the substrates to and from said treating modules and transfer of the substrates to and from said substrate rests.

17. A substrate treating apparatus as defined in claim 16, wherein:
   said inlet substrate rests include a feed inlet substrate rest for use in transporting the substrates forward through each of said controlled units, and a return inlet substrate rest for use in transporting the substrates backward through each of said controlled units; and
   said outlet substrate rests include a feed outlet substrate rest for use in transporting the substrates forward through each of said controlled units, and a return outlet substrate rest for use in transporting the substrates backward through each of said controlled units.

18. A substrate treating apparatus as defined in claim 17, wherein at least one of said controlled units has an additional inlet substrate rest and an additional outlet substrate rest besides said feed inlet substrate rest, said return inlet substrate rest, said feed outlet substrate rest and said return outlet substrate rest.

19. A substrate treating apparatus as defined in claim 17, wherein said feed inlet substrate rest and said return outlet substrate rest are arranged close to each other, and said return inlet substrate rest and said feed outlet substrate rest are arranged close to each other.

20. A substrate treating apparatus as defined in claim 19, wherein said feed inlet substrate rest and said return outlet substrate rest are arranged vertically, and said return inlet substrate rest and said feed outlet substrate rest are arranged vertically.

21. A substrate treating apparatus as defined in claim 16, wherein at least one of said substrate rests has a construction for receiving a plurality of substrates in multiple stages.

22. A substrate treating apparatus as defined in claim 16, wherein at least one of said substrate rests has a shutter mechanism for closing an opening allowing passage of said substrates.

23. A substrate treating apparatus as defined in claim 16, wherein at least one of said substrate rests has cooling means for cooling the substrates placed thereon.

24. A substrate treating apparatus as defined in claim 16, wherein at least one of said substrate rests has horizontal moving means horizontally movable toward said main transport mechanism.

25. A substrate treating apparatus as defined in claim 16, wherein said main transport mechanism has at least two holding arms for holding the substrates.

26. A substrate treating apparatus as defined in claim 25, wherein said main transport mechanism is arranged, when transferring substrates to and from one of said inlet substrate rests and one of said outlet substrate rests, with one of said holding arms holding a substrate, and the other holding arm unloaded, to drive said one of said holding arms and transfer said substrate to said one of said outlet substrate rests, and thereafter to drive one of said holding arms, both now unloaded, and receive a different substrate from said one of said inlet substrate rests.

27. A substrate treating apparatus as defined in claim 17, wherein:
   said main transport mechanism has at least two holding arms for holding the substrates; and
   said main transport mechanism is arranged, when transferring substrates to and from one of said inlet substrate rests and one of said outlet substrate rests, with one of said holding arms holding a substrate, and the other holding arm unloaded, to drive said one of said holding arms and transfer said substrate to said one of said outlet substrate rests, thereafter to determine whether an abnormality has occurred with a destination forward or backward with respect to a direction of transport through one of said treating blocks or controlled units in which said main transport mechanism is disposed, and when an abnormality is confirmed, to transport the substrates only in a direction free from said abnormality.

28. A substrate treating apparatus as defined in claim 26, wherein:
   said treating modules include heat-treating modules having heating plates for heating the substrates and cooling plates for cooling the substrates; and
   said main transport mechanism is arranged to drive one of said at least two holding arms in unloaded state to receive a different substrate from one of said inlet substrate rests, to fulfill a condition that, in every transport cycle, the same one of said at least two holding arms receives substrates heated by said heating plates.

29. A substrate treating apparatus as defined in claim 17, wherein, when said feed inlet substrate rest and said return inlet substrate rest both have substrates placed thereon, said main transport mechanism receives the substrate from said return inlet substrate rest by priority.

30. A substrate treating apparatus as defined in claim 29, wherein:

said main transport mechanism has at least two holding arms for holding the substrates; and said main transport mechanism is arranged, when transferring substrates to and from said feed inlet substrate rest and said return outlet substrate rest, with one of said holding arms holding a substrate, and the other holding arm unloaded, to drive said one of said holding arms and transfer said substrate to said return outlet substrate rest, thereafter to determine whether said return inlet substrate rest has a substrate placed thereon, when no substrate is found, to drive one of said holding arms in unloaded state and receive a different substrate from said feed inlet substrate rest, and when a substrate is found on said return inlet substrate rest, to move toward said return inlet substrate rest, without receiving the substrate from said feed inlet substrate rest, and with all said holding arms in unloaded state, and receive the substrate from said return inlet substrate rest for a predetermined transport process.

31. A substrate treating apparatus as defined in claim 16, wherein said unit control means is connected to main control means for performing an overall control thereof, said main control means being constructed to communicate with a host computer separate from said substrate treating apparatus.

* * * * *